(12) United States Patent
Takemura et al.

(10) Patent No.: US 11,349,092 B2
(45) Date of Patent: May 31, 2022

(54) PHOTOELECTRIC CONVERSION ELEMENT, SOLID-STATE IMAGING DEVICE, AND ELECTRONIC APPARATUS

(71) Applicant: SONY SEMICONDUCTOR SOLUTIONS CORPORATION, Kanagawa (JP)

(72) Inventors: Ichiro Takemura, Kanagawa (JP); Yuki Negishi, Kanagawa (JP); Yuta Hasegawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/574,592

(22) PCT Filed: May 19, 2016

(86) PCT No.: PCT/JP2016/064884
§ 371 (c)(1),
(2) Date: Nov. 16, 2017

(87) PCT Pub. No.: WO2016/190217
PCT Pub. Date: Dec. 1, 2016

(65) Prior Publication Data
US 2018/0159059 A1 Jun. 7, 2018

(30) Foreign Application Priority Data
May 28, 2015 (JP) .............................. JP2015-108832

(51) Int. Cl.
H01L 31/00 (2006.01)
H01L 51/44 (2006.01)
(Continued)

(52) U.S. Cl.
CPC ........ *H01L 51/441* (2013.01); *H01L 27/1464* (2013.01); *H01L 27/14609* (2013.01);
(Continued)

(58) Field of Classification Search
CPC ................................................... H01L 51/0047
(Continued)

(56) References Cited

U.S. PATENT DOCUMENTS

2006/0162768 A1* 7/2006 Wanlass ............ H01L 31/06875
136/262
2007/0012955 A1* 1/2007 Ihama .................. H01L 51/448
257/233
(Continued)

FOREIGN PATENT DOCUMENTS

CN 101908574 A 12/2010
CN 101964352 A 2/2011
(Continued)

OTHER PUBLICATIONS

International Search Report and Written Opinion of PCT Application No. PCT/JP2016/064884, dated Jun. 21, 2016, 10 pages of English Translation and 08 pages of ISRWO.
(Continued)

Primary Examiner — Angelo Trivisonno
(74) Attorney, Agent, or Firm — Chip Law Group

(57) ABSTRACT

A photoelectric conversion element according to an embodiment of the disclosure includes a first electrode and a second electrode, and an organic semiconductor layer. The first electrode and the second electrode are disposed to face each other. The organic semiconductor layer is provided between the first electrode and the second electrode, and contains a fullerene derivative modified by a substituent having an absorbance smaller than that of a fullerene.

5 Claims, 13 Drawing Sheets

(51) Int. Cl.
| | |
|---|---|
| *H01L 31/10* | (2006.01) |
| *H01L 27/146* | (2006.01) |
| *H01L 51/00* | (2006.01) |
| *H04N 9/04* | (2006.01) |
| *H01L 51/42* | (2006.01) |
| *H04N 5/369* | (2011.01) |
| *H01L 31/0224* | (2006.01) |
| *H01L 27/30* | (2006.01) |

(52) U.S. Cl.
CPC .. *H01L 27/14645* (2013.01); *H01L 27/14667* (2013.01); *H01L 31/022425* (2013.01); *H01L 31/10* (2013.01); *H01L 51/0047* (2013.01); *H01L 51/0078* (2013.01); *H01L 51/42* (2013.01); *H04N 5/369* (2013.01); *H04N 9/045* (2013.01); *H01L 27/14603* (2013.01); *H01L 27/307* (2013.01)

(58) Field of Classification Search
USPC .......................................................... 136/263
See application file for complete search history.

(56) References Cited

U.S. PATENT DOCUMENTS

| | | | | |
|---|---|---|---|---|
| 2007/0062577 A1* | 3/2007 | Koppe | ................... | B82Y 10/00 |
| | | | | 136/263 |
| 2010/0175750 A1* | 7/2010 | Gambino | .......... | H01L 31/02168 |
| | | | | 136/256 |
| 2010/0308372 A1* | 12/2010 | Mitsui | .................... | B82Y 10/00 |
| | | | | 257/184 |
| 2011/0019042 A1 | 1/2011 | Yamaguchi | | |
| 2013/0033628 A1* | 2/2013 | Yamaguchi | ........... | H01L 27/286 |
| | | | | 348/294 |
| 2014/0083484 A1 | 3/2014 | Nakao et al. | | |
| 2015/0334327 A1 | 11/2015 | Yamaguchi | | |

FOREIGN PATENT DOCUMENTS

| | | |
|---|---|---|
| CN | 102254924 A | 11/2011 |
| EP | 2259359 A2 | 12/2010 |
| EP | 2667426 A1 | 11/2013 |
| JP | 2003-332551 A | 11/2003 |
| JP | 2007-123707 A | 5/2007 |
| JP | 2011-009347 A | 1/2011 |
| JP | 2011-014893 A | 1/2011 |
| JP | 2011-029337 A | 2/2011 |
| JP | 2011-139071 A | 7/2011 |
| JP | 2011-199253 A | 10/2011 |
| JP | 2014-067921 A | 4/2014 |
| JP | 5704169 B2 | 4/2015 |
| JP | 2015-149483 A | 8/2015 |
| KR | 10-2010-0131390 A | 12/2010 |
| KR | 10-2011-0010058 A | 1/2011 |
| TW | 201109419 A | 3/2011 |
| TW | 201130120 A | 9/2011 |
| WO | 2011/148717 A1 | 12/2011 |

OTHER PUBLICATIONS

International Preliminary Report on Patentability of PCT Application No. PCT/JP2016/064884, dated Dec. 7, 2017, 10 pages of English Translation and 05 pages of IPRP.

* cited by examiner

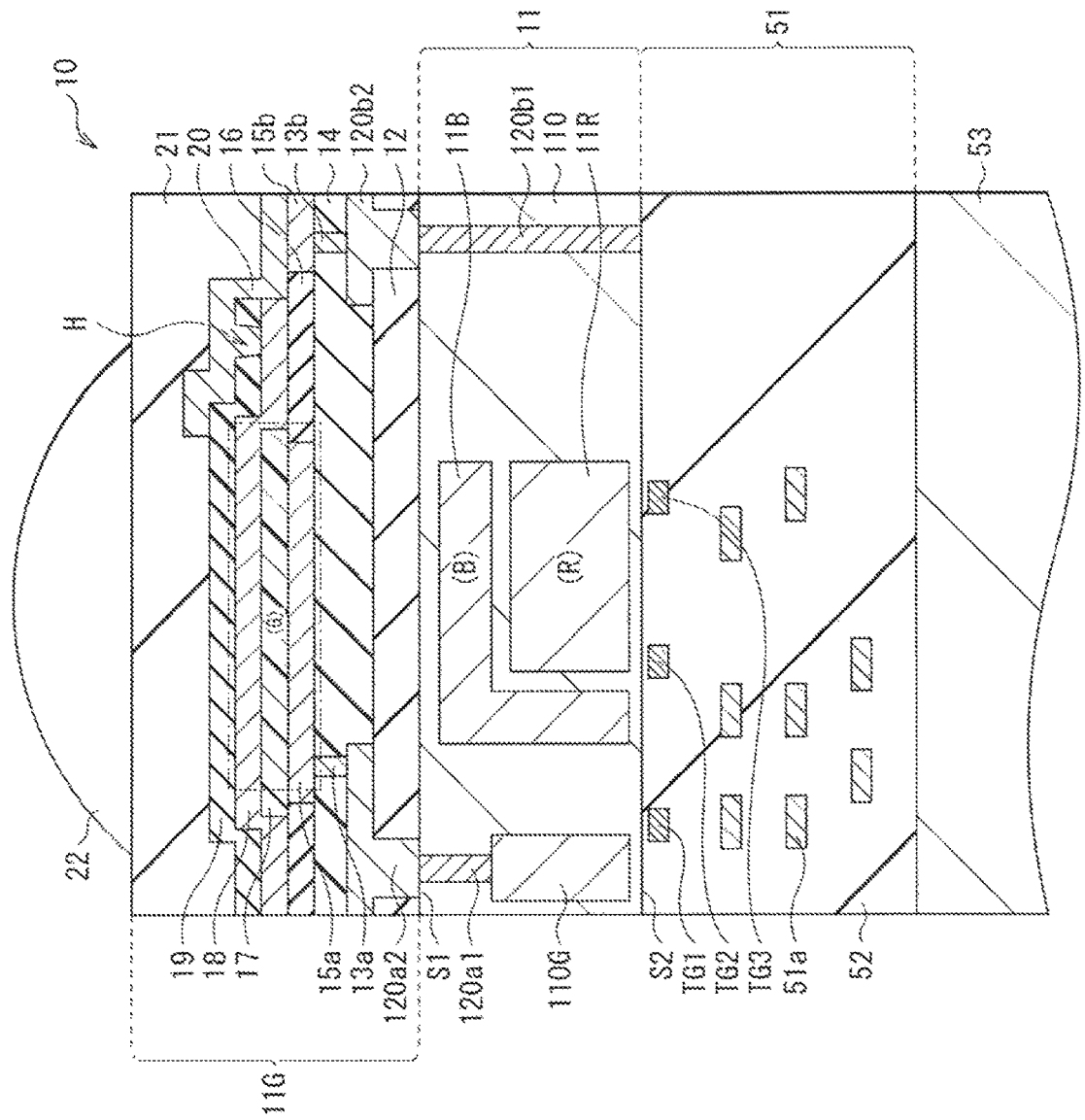

[FIG. 2]
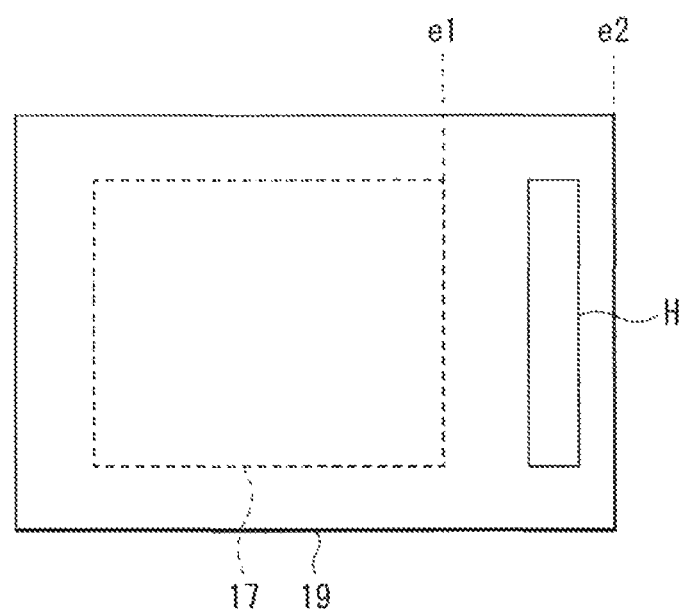

[ FIG. 3A ]
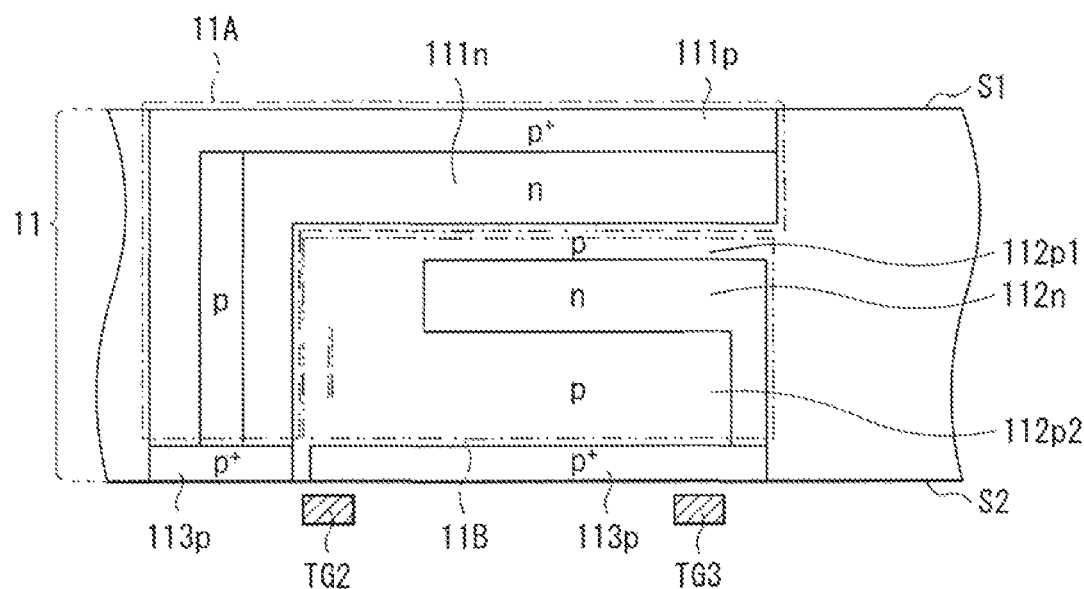
[ FIG. 3B ]
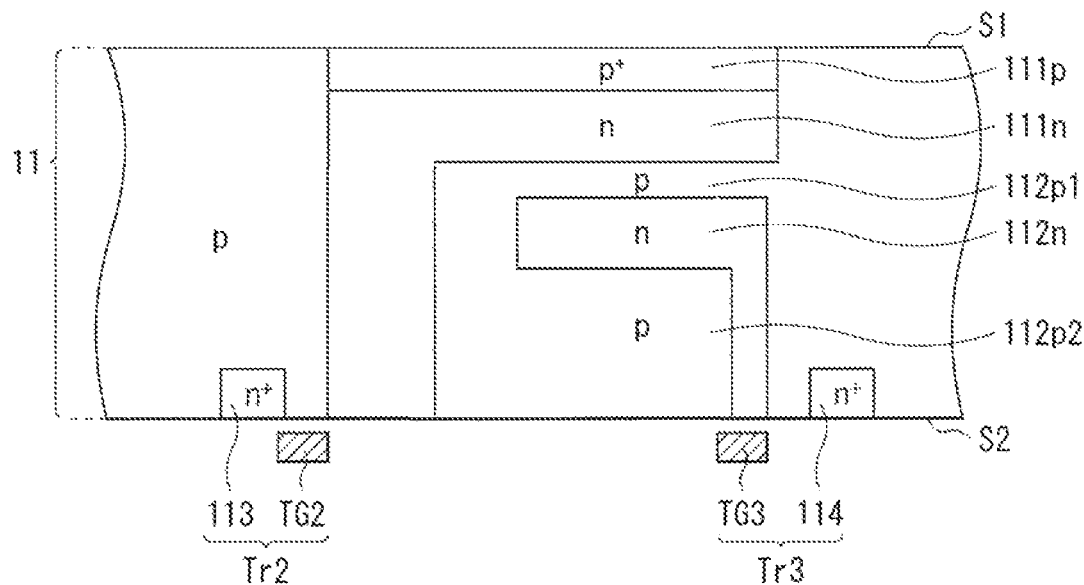

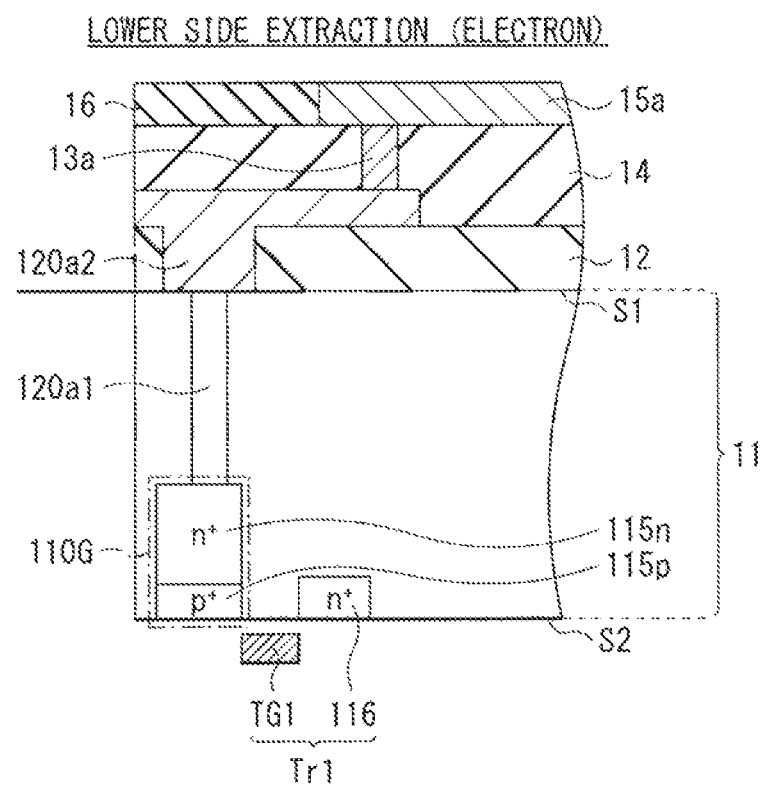

[ FIG. 5A ]
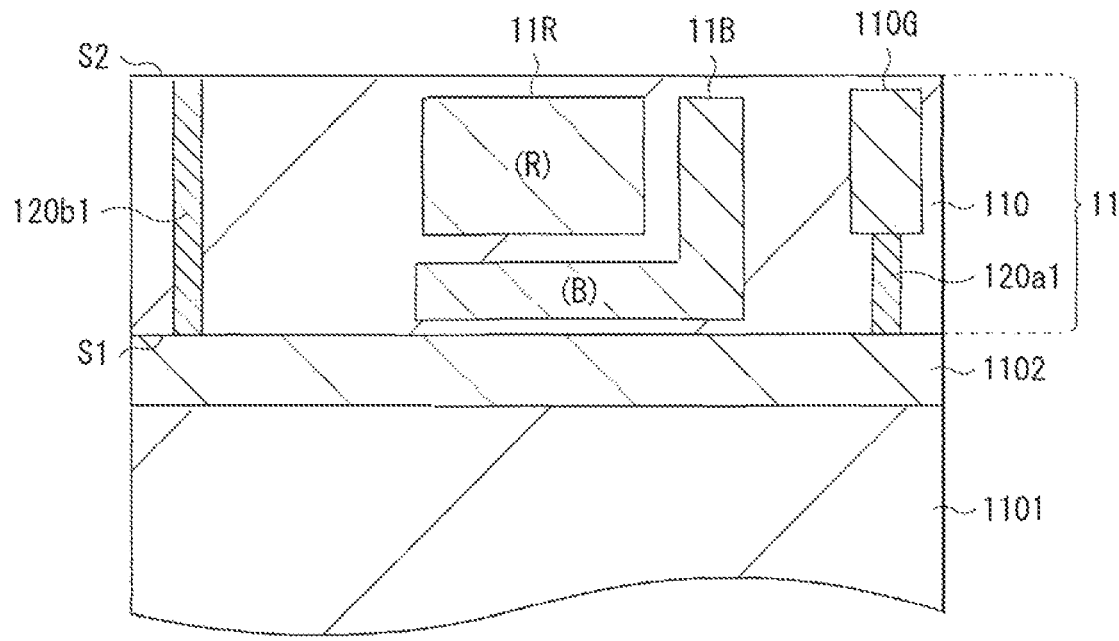
[ FIG. 5B ]
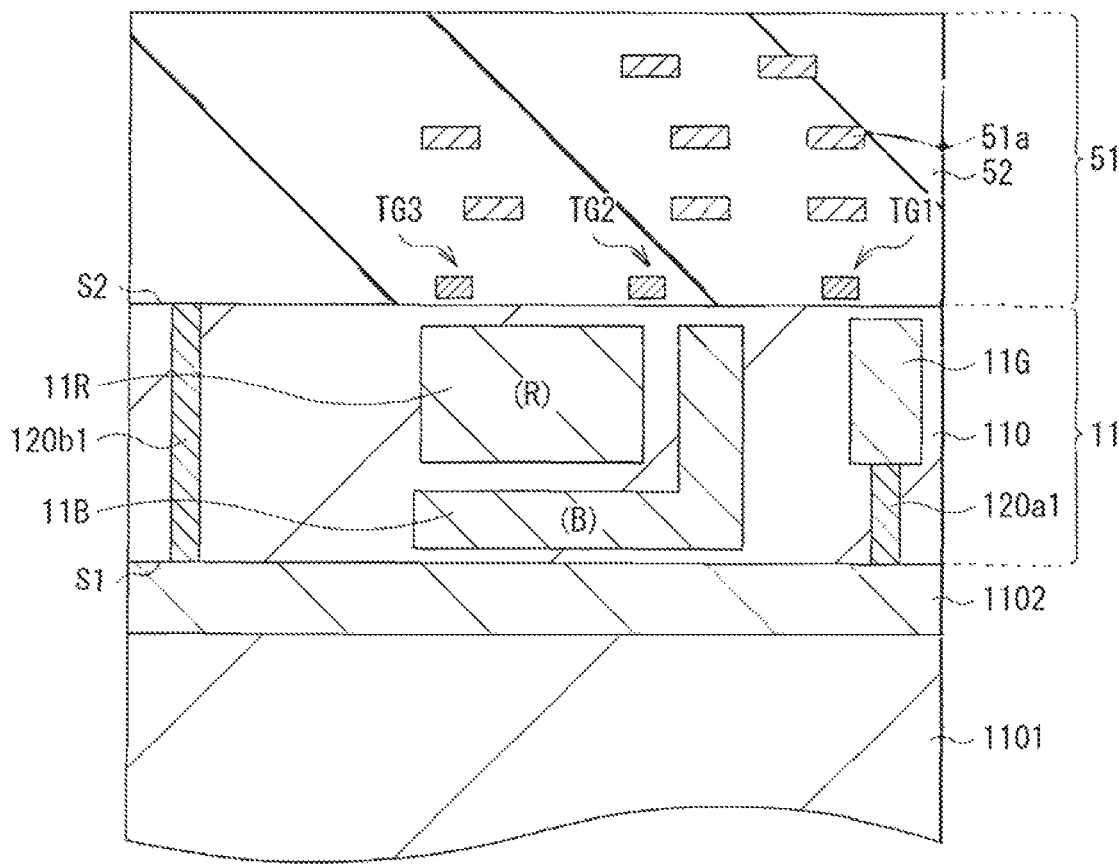

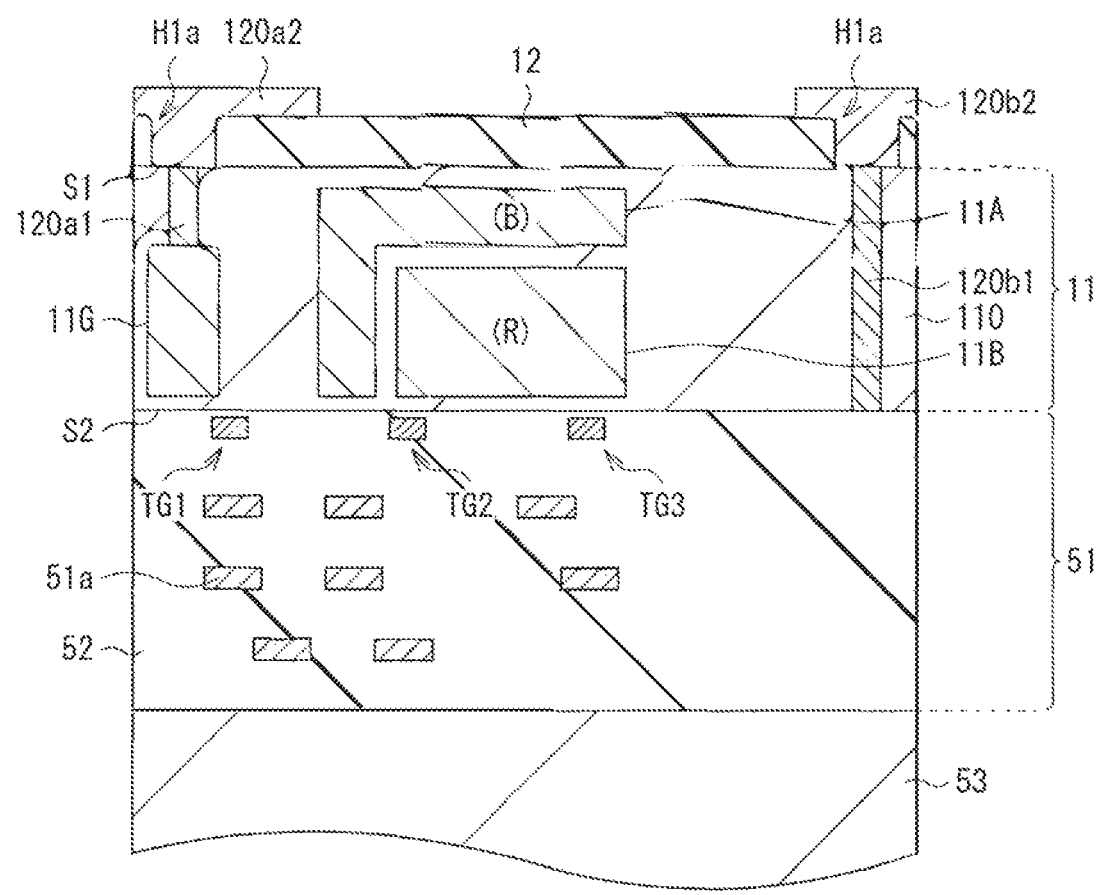
[FIG. 6A]

[FIG. 6B]
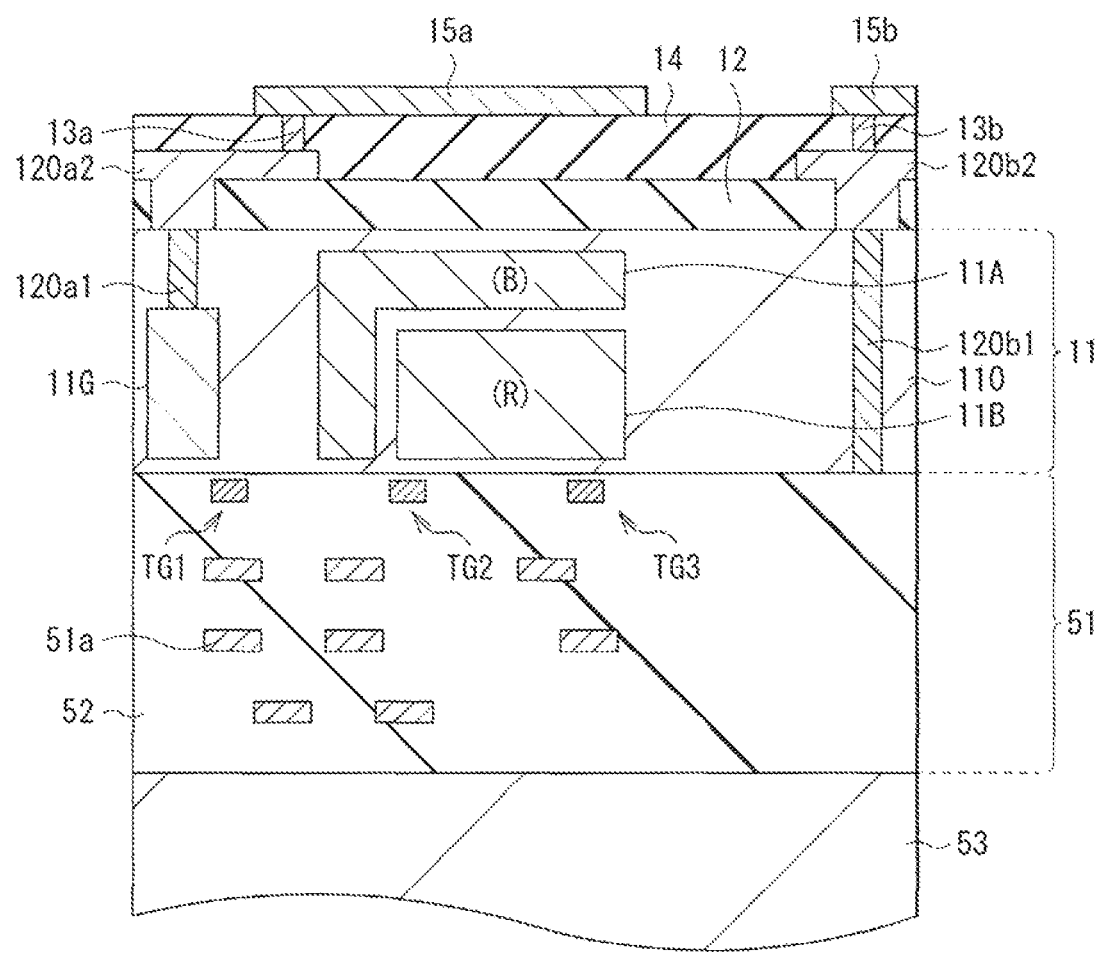

[FIG. 7A]
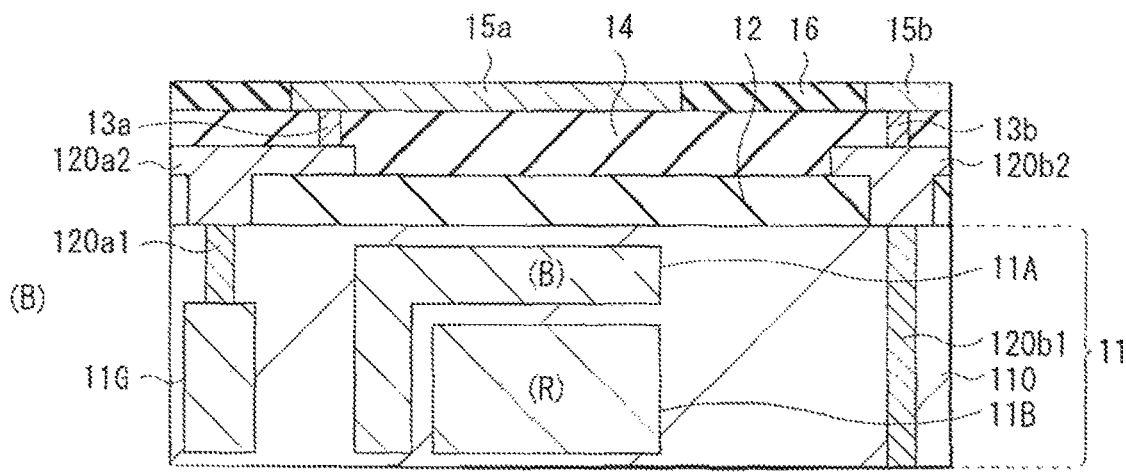
[FIG. 7B]
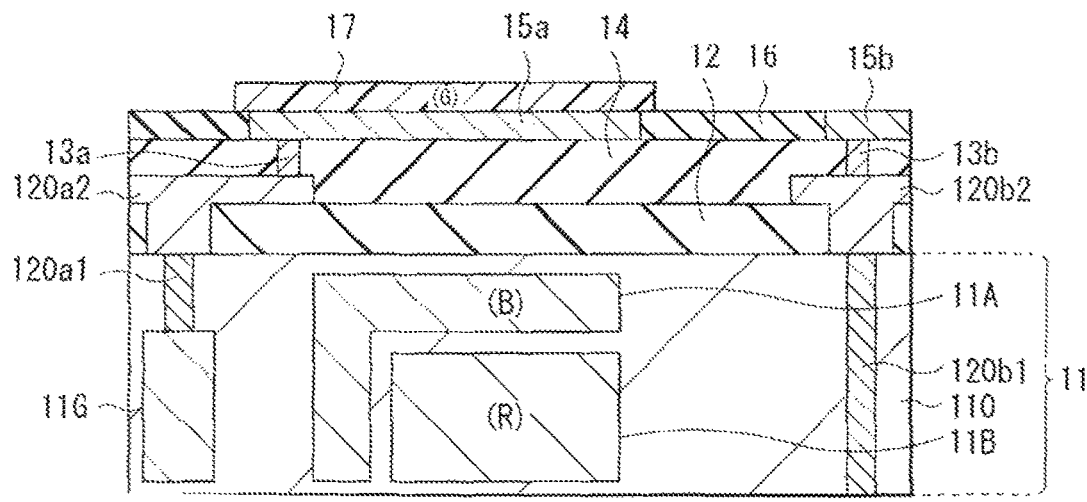
[FIG. 7C]
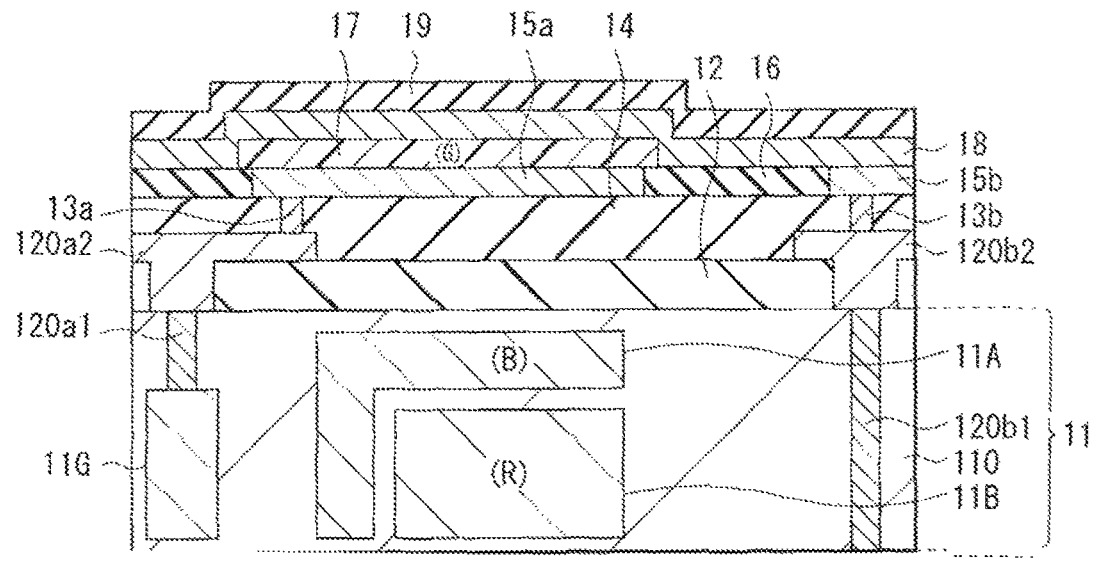

[FIG. 8]
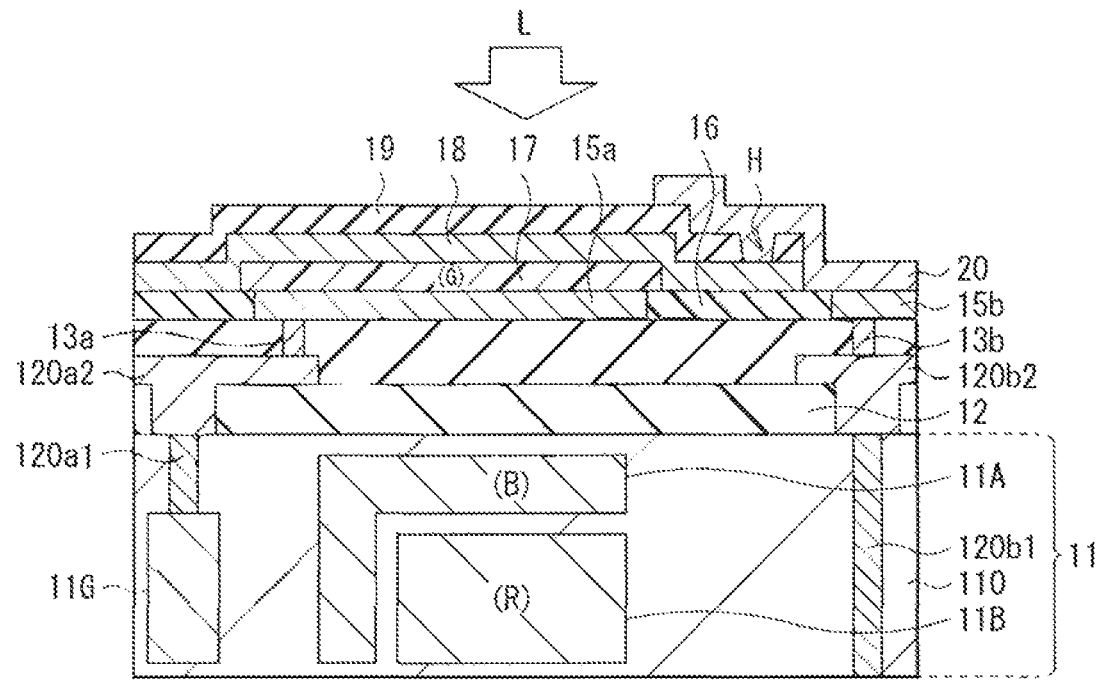
[FIG. 9]
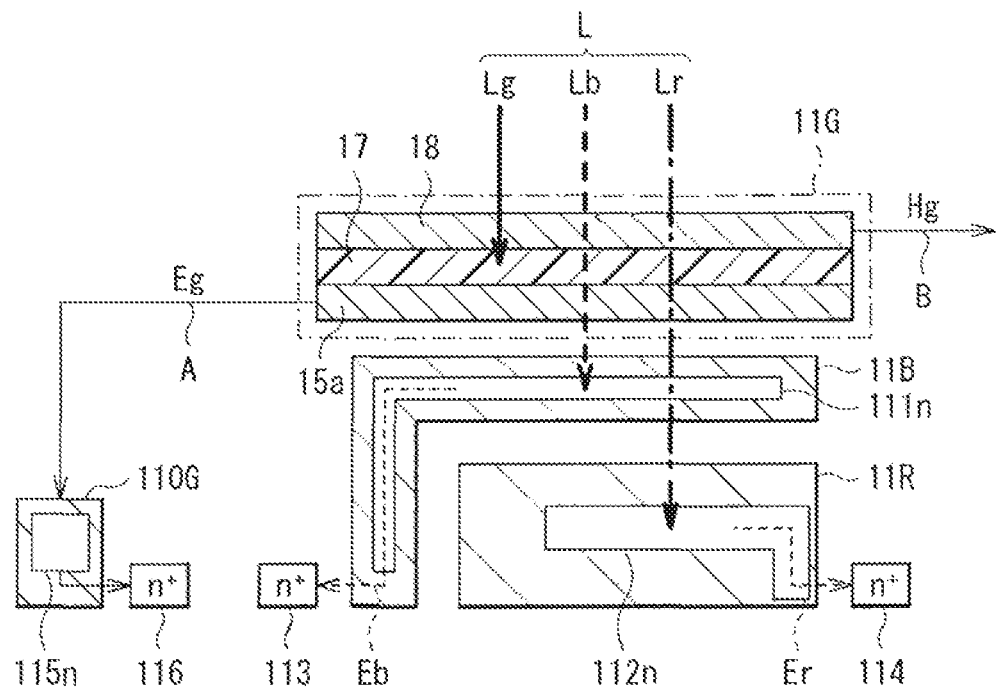

[ FIG. 10 ]
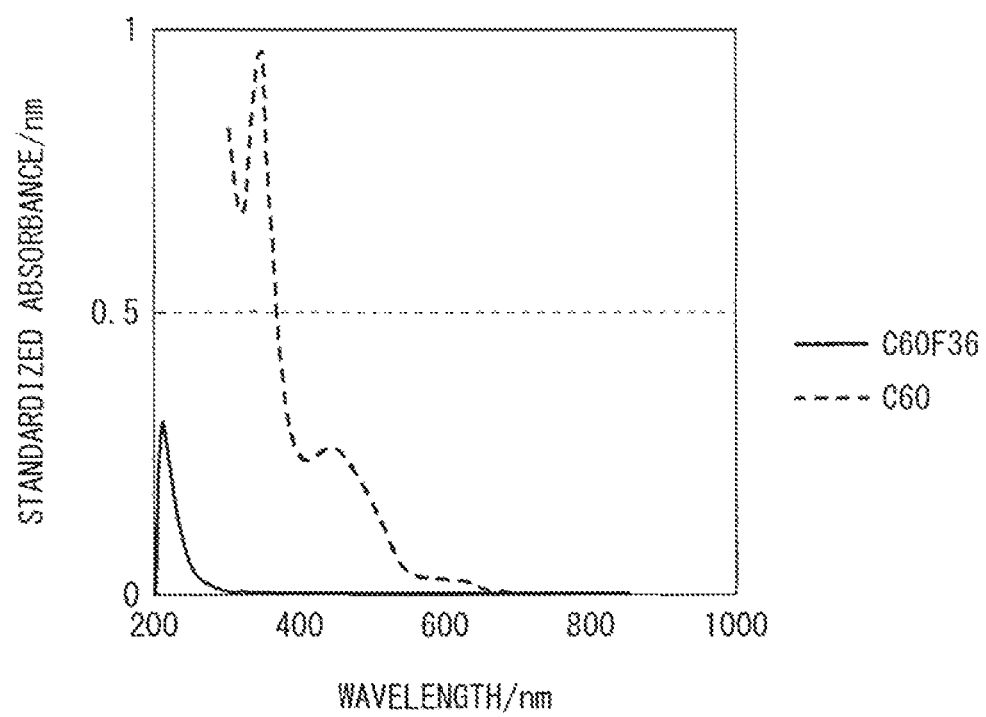
[ FIG. 11 ]
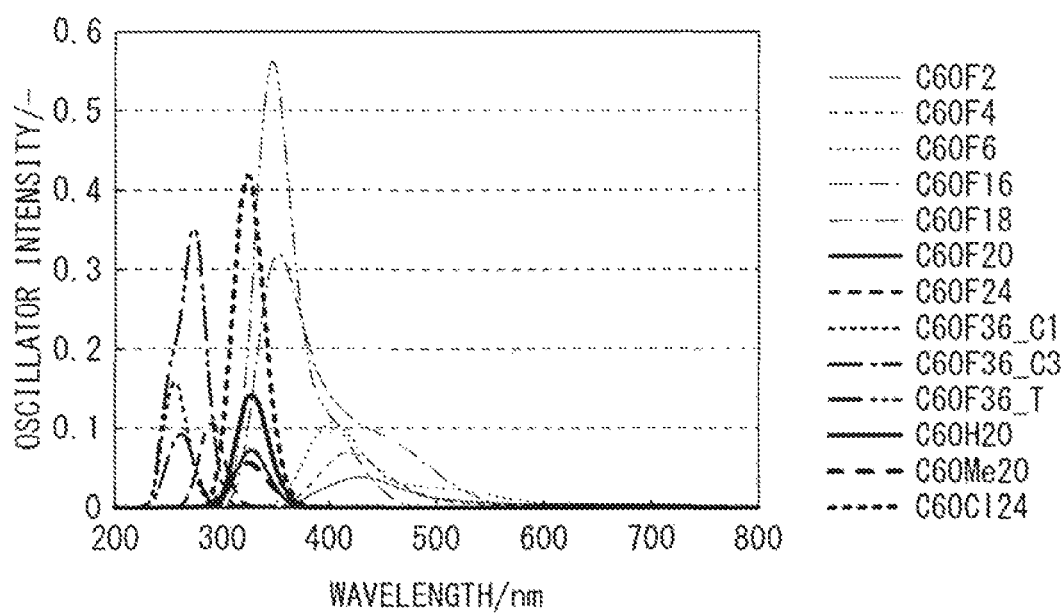

[ FIG. 12 ]
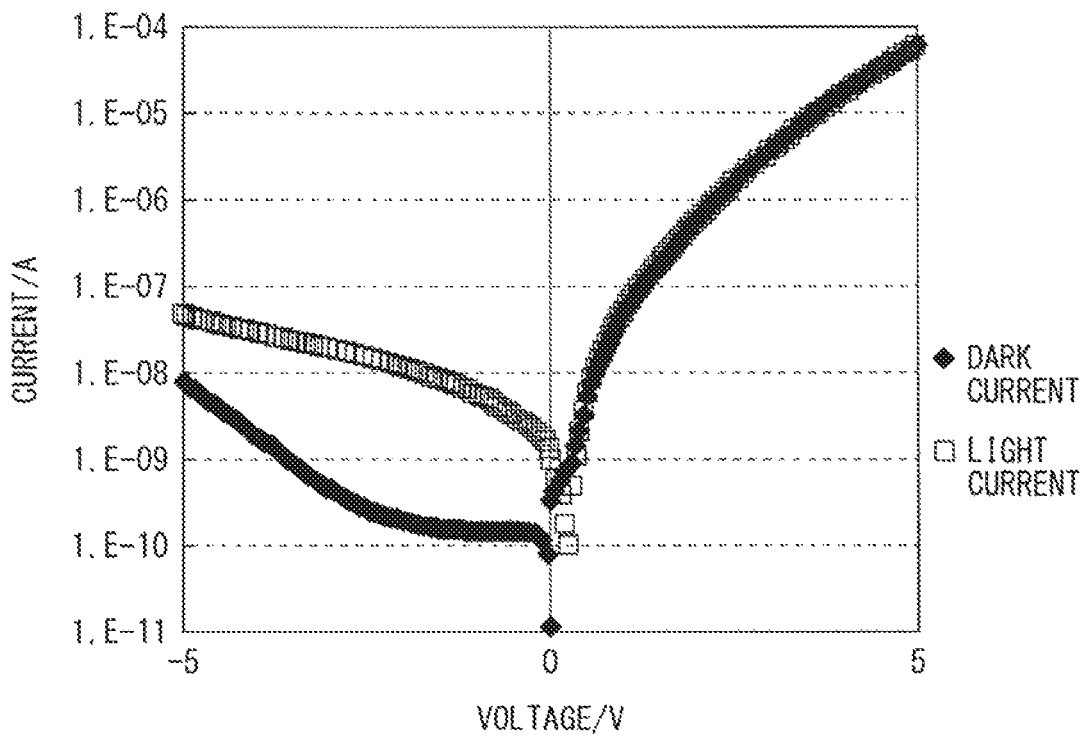
[ FIG. 13 ]
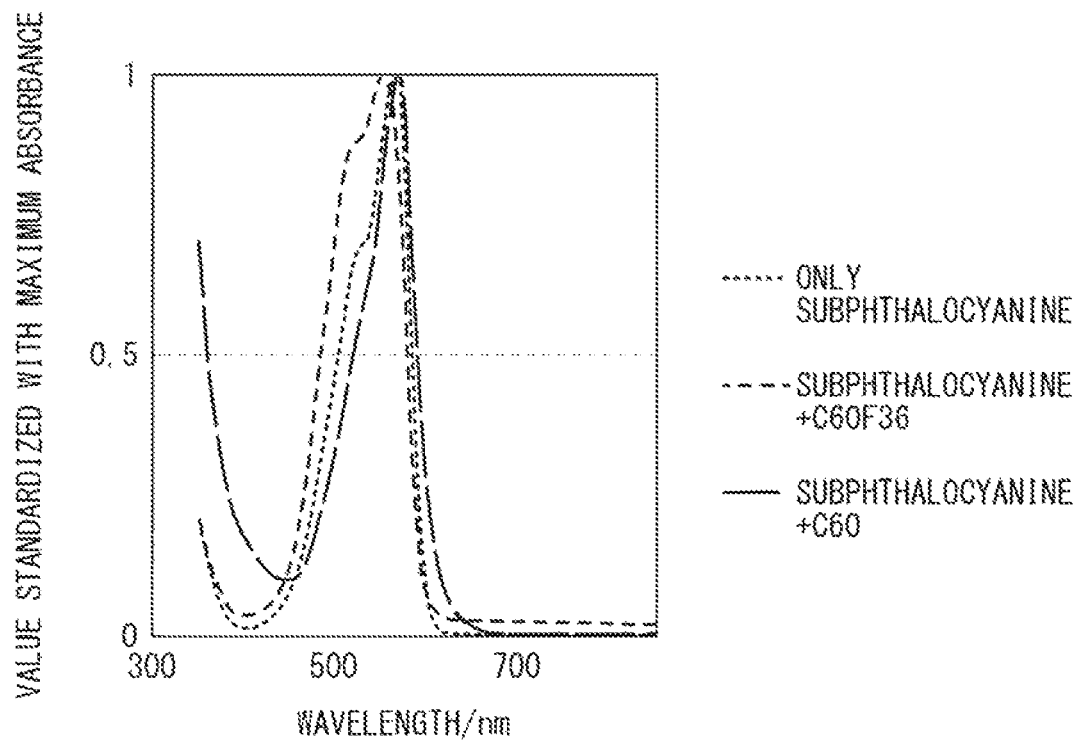

[ FIG. 14 ]
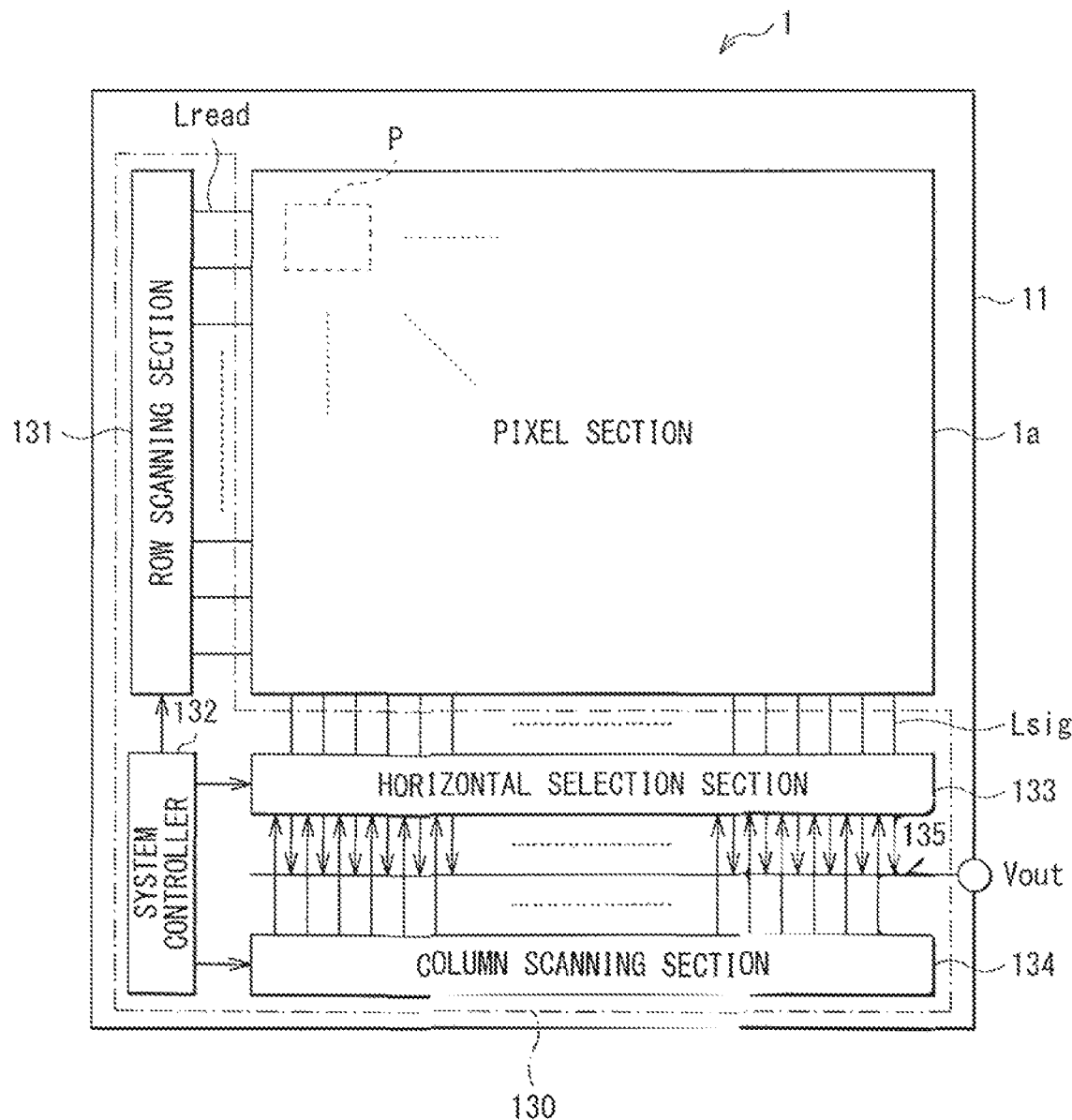

[ FIG. 15 ]
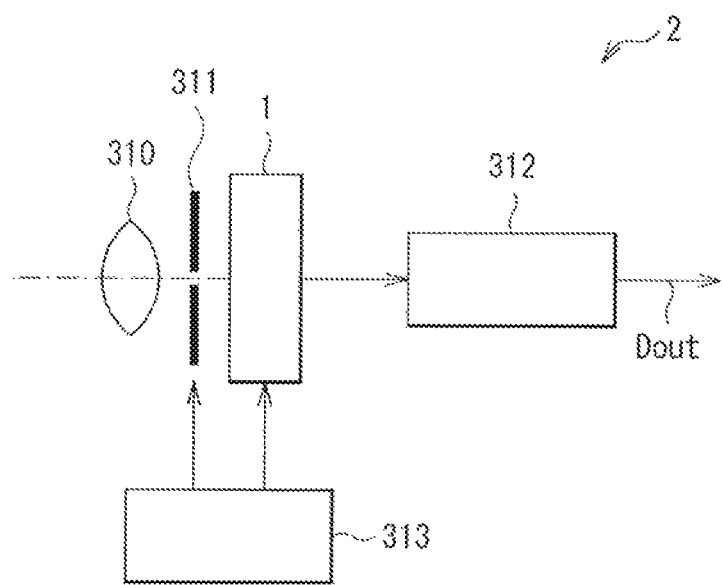

PHOTOELECTRIC CONVERSION ELEMENT, SOLID-STATE IMAGING DEVICE, AND ELECTRONIC APPARATUS

CROSS REFERENCE TO RELATED APPLICATIONS

This application is a U.S. National Phase of International Patent Application No. PCT/JP2016/064884 filed on May 19, 2016, which claims priority benefit of Japanese Patent Application No. JP 2015-108832 filed in the Japan Patent Office on May 28, 2015. Each of the above-referenced applications is hereby incorporated herein by reference in its entirety.

TECHNICAL FIELD

The disclosure relates to, for example, a photoelectric conversion element using an organic semiconductor, a solid-state imaging device provided with the photoelectric conversion element, and an electronic apparatus.

BACKGROUND ART

In recent years, there has been progress in miniaturization of a pixel size in a solid-state imaging device such as a charge coupled device (CCD) image sensor and a complementary metal oxide semiconductor (CMOS) image sensor. This leads to a decrease in the number of photons that enter a unit pixel, thus leading to lowered sensitivity as well as a lowered S/N ratio. Further, in a case of using a color filter in which primary color filters of red, green, and blue are two-dimensionally arrayed for colorization, pieces of light of green and blue are absorbed by the color filter in a red pixel, thus causing the sensitivity to be lowered. Furthermore, an interpolation process is performed between pixels upon generation of each color signal, thus causing occurrence of a so-called false color.

Accordingly, for example, PTL 1 discloses a solid-state imaging device including, in a single pixel, for example, an organic photoelectric conversion section that detects green light to generate a signal electric charge in accordance with the detected green light, and photodiodes (inorganic photoelectric conversion sections) that detect red light and blue light, respectively. The disclosed solid-state imaging device thus obtains three color signals in the single pixel to improve the lowered sensitivity.

Moreover, for the purpose of further improving a photoelectric conversion efficiency, for example, PTL 2 discloses a photoelectric conversion element using a fullerene or a fullerene derivative as a p-type semiconductor of a photoelectric conversion film configured by the p-type semiconductor and an n-type semiconductor. PTL 3 discloses a photoelectric conversion element using, as a photoelectric conversion layer, an organic photoelectric conversion dye, a fullerene or a fullerene derivative, and a fullerene polymer.

CITATION LIST

Patent Literature

PTL 1: Japanese Unexamined Patent Application Publication No. 2003-332551
PTL 2: Japanese Unexamined Patent Application Publication No. 2007-123707
PTL 3: Japanese Unexamined Patent Application Publication No. 2011-199253

SUMMARY OF INVENTION

However, as in the above-described PTLs 2 and 3, in a case where the photoelectric conversion layer itself has a spectroscopic function, when simply using the fullerene or the fullerene derivative as the photoelectric conversion layer, there is an issue of a deteriorated spectroscopic shape of the photoelectric conversion element due to a broad absorption spectrum of the fullerene, which leads to lowered color reproducibility.

It is therefore desirable to provide a photoelectric conversion element, a solid-state imaging device, and an electronic apparatus that make it possible to improve a photoelectric conversion efficiency of a predetermined wavelength region.

A photoelectric conversion element according to an embodiment of the disclosure includes a first electrode and a second electrode, and an organic semiconductor layer. The first electrode and the second electrode are disposed to face each other. The organic semiconductor layer is provided between the first electrode and the second electrode, and contains a fullerene derivative modified by a substituent having an absorbance smaller than that of a fullerene.

A solid-state imaging device according to an embodiment of the disclosure is provided with pixels each having one or a plurality of organic photoelectric conversion sections. The organic photoelectric conversion section includes a first electrode and a second electrode, and an organic semiconductor layer. The first electrode and the second electrode are disposed to face each other. The organic semiconductor layer is provided between the first electrode and the second electrode, and contains a fullerene derivative modified by a substituent having an absorbance smaller than that of a fullerene in a visible range.

An electronic apparatus of the disclosure includes the above-described solid-state imaging device according to the embodiment of the disclosure.

According to the photoelectric conversion element, the solid-state imaging device, and the electronic apparatus of the respective embodiments of the disclosure, the fullerene derivative modified by a substituent having an absorbance smaller than that of a fullerene in a visible range is used as the semiconductor layer provided between the first electrode and the second electrode that are disposed to face each other. Subjecting a fullerene to polysubstituted modification causes an absorption wavelength peak to be shifted toward shorter wavelength side, and reduces an interaction between fullerenes. This improves the spectroscopic shape of the photoelectric conversion element using the fullerene.

According to the photoelectric conversion element, the solid-state imaging device, and the electronic apparatus of the respective embodiments of the disclosure, the semiconductor layer provided between the first electrode and the second electrode contains the fullerene derivative modified by a substituent having an absorbance smaller than that of a fullerene in a visible range. Accordingly, the absorption wavelength peak of the fullerene is shifted toward shorter wavelength side, and an interaction between fullerenes are reduced, thus improving the spectroscopic shape of the photoelectric conversion element using the fullerene. In other words, it becomes possible to enhance the photoelectric conversion efficiency of the predetermined wavelength region. It is to be noted that the effects described here are not necessarily limitative, and may be any of effects described in the disclosure.

BRIEF DESCRIPTION OF DRAWINGS

FIG. 1 is a cross-sectional view of an outline configuration of a photoelectric conversion element according to an embodiment of the disclosure.

FIG. 2 is plan view of a correlation among an organic photoelectric conversion layer, a protective film (upper electrode), and a contact hole in terms of position of formation thereof.

FIG. 3A is a cross-sectional view of a configuration example of an inorganic photoelectric conversion section.

FIG. 3B is another cross-sectional view of the inorganic photoelectric conversion section illustrated in FIG. 3A.

FIG. 4 is a cross-sectional view of a configuration (extraction of electrons on lower side) of an electric charge (electron) accumulation layer of an organic photoelectric conversion section.

FIG. 5A is a cross-sectional view that describes a method of manufacturing the photoelectric conversion element illustrated in FIG. 1.

FIG. 5B is a cross-sectional view of a step subsequent to FIG. 5A.

FIG. 6A is a cross-sectional view of a step subsequent to FIG. 5B.

FIG. 6B is a cross-sectional view of a step subsequent to FIG. 6A.

FIG. 7A is a cross-sectional view of a step subsequent to FIG. 6B.

FIG. 7B is a cross-sectional view of a step subsequent to FIG. 7A.

FIG. 7C is a cross-sectional view of a step subsequent to FIG. 7B.

FIG. 8 is an explanatory cross-sectional view of a main part that describes a working of the photoelectric conversion element illustrated in FIG. 1.

FIG. 9 is a schematic diagram that describes the working of the photoelectric conversion element illustrated in FIG. 1.

FIG. 10 illustrates ultraviolet visible absorption spectra of a fullerene ($C_{60}$) and a fullerene derivative ($C_{60}F_{36}$).

FIG. 11 illustrates ultraviolet visible absorption spectra of fullerene derivatives.

FIG. 12 illustrates current-voltage characteristics of the organic photoelectric conversion section of the present embodiment before and after light irradiation.

FIG. 13 illustrates ultraviolet visible absorption spectra of the organic photoelectric conversion layer of the present embodiment.

FIG. 14 is a functional block diagram of a solid-state imaging device using, as a pixel, the photoelectric conversion element illustrated in FIG. 1.

FIG. 15 is a block diagram illustrating an outline configuration of an electronic apparatus using the solid-state imaging device illustrated in FIG. 14.

MODES FOR CARRYING OUT THE INVENTION

In the following, some embodiments of the disclosure are described in detail with reference to drawings. It is to be noted that description is given in the following order.
1. Embodiment (An example in which fullerene having undergone polysubstituted modification is used for organic photoelectric conversion section)

1-1. Basic Configuration
1-2. Manufacturing Method
1-3. Workings and Effects
2. Application Examples

1. EMBODIMENT

FIG. 1 illustrates a cross-sectional configuration of a photoelectric conversion element (photoelectric conversion element 10) according to an embodiment of the disclosure. The photoelectric conversion element 10 constitute a single pixel in, for example, a solid-state imaging device (described later) such as a CCD image sensor and a CMOS image sensor. The photoelectric conversion element 10 includes, on side of a front surface (surface S2 opposite to light-receiving surface) of a semiconductor substrate 11, pixel transistors (including transfer transistors Tr1 to Tr3 described later) formed as well as a multi-layer wiring layer (multi-layer wiring layer 51).

The photoelectric conversion element 10 of the present embodiment has a structure in which one organic photoelectric conversion section 11G and two inorganic photoelectric conversion sections 11B and 11R are stacked in a vertical direction. The organic photoelectric conversion section 11G selectively detects pieces of light of different wavelength regions to perform photoelectric conversion. The organic photoelectric conversion section 11G includes an organic semiconductor and a fullerene having undergone polysubstituted modification (fullerene derivative).

(1-1. Basic Configuration)

The photoelectric conversion element 10 has a stacked structure of one organic photoelectric conversion section 11G and two inorganic photoelectric conversion sections 11B and 11R. This allows for obtainment of respective color signals of red (R), green (G), and blue (B) using a single element. The organic photoelectric conversion section 11G is formed on a rear surface (surface S1) of the semiconductor substrate 11, and the inorganic photoelectric conversion sections 11B and 11R are formed to be embedded inside the semiconductor substrate 11. Description is given below of a configuration of each section.

(Organic Photoelectric Conversion Section 11G)

The organic photoelectric conversion section 11G is an organic photoelectric conversion element that uses an organic semiconductor to absorb light (green light in this example) of a selective wavelength region, thus generating an electron-hole pair. The organic photoelectric conversion section 11G has a configuration in which an organic photoelectric conversion layer 17 is interposed between a pair of electrodes (lower electrode 15a and upper electrode 18) that extract a signal electric charge. As described later, the lower electrode 15a and the upper electrode 18 are electrically coupled to electrically-conductive plugs 120a1 and 120b1 each embedded inside the semiconductor substrate 11, through a wiring layer and a contact metal layer. It is to be noted that the organic photoelectric conversion layer 17 of the present embodiment is a specific example of an "organic semiconductor layer" in the disclosure.

Specifically, in the organic photoelectric conversion section 11G, interlayer insulating films 12 and 14 are formed on the surface S1 of the semiconductor substrate 11. The interlayer insulating film 12 has through-holes provided in respective regions that face the electrically-conductive plugs 120a1 and 120b1 described later. Electrically-conductive plugs 120a2 and 120b2 are embedded in the respective through-holes. The interlayer insulating film 14 has wiring layers 13a and 13b embedded in respective regions that face the electrically-conductive plugs 120a2 and 120b2. The lower electrode 15a and a wiring layer 15b electrically separated from the lower electrode 15a by the insulating film 16 are provided on the interlayer insulating film 14. The organic photoelectric conversion layer 17 is formed on the lower electrode 15a, among those, and the upper electrode 18 is formed to cover the organic photoelectric conversion layer 17. A protective film 19 is formed on the upper electrode 18 to cover a surface of the upper electrode 18, although the detail is described later. A contact hole H is provided in a predetermined region of the protective film 19, and a contact metal layer 20 is formed on the protective film 19. The contact metal layer 20 fills the contact hole H, and extends up to a top surface of the wiring layer 15b.

The electrically-conductive plug 120a2 functions as a connector together with the electrically-conductive plug 120a1, and forms a transmission path of an electric charge (electron) from the lower electrode 15a to a green electricity storage layer 110G described later. The electrically-conductive plug 120b2 functions as a connector together with the electrically-conductive plug 120b1, and forms a discharge path of an electric charge (hole) from the upper electrode 18 together with the electrically-conductive plug 120b1, the wiring layer 13b, the wiring layer 15b, and the contact metal layer 20. The electrically-conductive plugs 120a2 and 120b2 are desirably configured by, for example, a stacked film of a metal material such as titanium (Ti), titanium nitride (TiN), and tungsten, in order to allow the electrically-conductive plugs 120a2 and 120b2 to function also as a light-shielding film. Further, the use of such a stacked film is desirable because this enables a contact with silicon to be secured also in a case where the electrically-conductive plugs 120a1 and 120b1 are each formed as an n-type or p-type semiconductor layer.

The interlayer insulating film 12 is desirably configured by an insulating film having a small interface state in order to reduce the interface state with the semiconductor substrate 11 (silicon layer 110) and to suppress occurrence of a dark current from an interface with the silicon layer 110. As such an insulating film, for example, a stacked film of a hafnium oxide ($HfO_2$) film and a silicon oxide ($SiO_2$) film may be used. The interlayer insulating film 14 is configured by a monolayer film made of one of silicon oxide, silicon nitride, and silicon oxynitride (SiON), for example, or alternatively is configured by a stacked film made of two or more thereof.

The insulating film 16 is configured by a monolayer film made of one of silicon oxide, silicon nitride, and silicon oxynitride (SiON), for example, or alternatively is configured by a stacked film made of two or more thereof. The insulating film 16 has a surface that is, for example, planarized, and has a substantially stepless shape and pattern with respect to the lower electrode 15a. The insulating film 16 has a function of electrically separating the electrodes 15a of the respective pixels from one another in a case where the photoelectric conversion element 10 is used as a pixel of the solid-state imaging device.

The lower electrode 15a is provided at a region that faces light-receiving surfaces of the inorganic photoelectric conversion sections 11B and 11R formed inside the semiconductor substrate 11 and covers the light-receiving surfaces. The lower electrode 15a is configured by an electrically-conductive film having light-transmissivity, and is made of an indium tin oxide (ITO), for example. However, as a constituent material of the lower electrode 15a, a dopant-doped tin oxide ($SnO_2$)-based material or a zinc oxide-based material in which aluminum zinc oxide (ZnO) is doped with a dopant may be used, besides the ITO. Examples of the zinc oxide-based material include aluminum zinc oxide (AZO) doped with aluminum (Al) as a dopant, gallium (Ga)-doped gallium zinc oxide (GZO), and indium (In)-doped indium zinc oxide (IZO). Aside from those mentioned above, for example, CuI, $InSbO_4$, ZnMgO, $CuInO_2$, $MgIN_2O_4$, CdO, and $ZnSnO_3$ may be used. It is to be noted that, in the present embodiment, a signal electric charge (electron) is extracted from the lower electrode 15a; thus, in the solid-state imaging device described later using the photoelectric conversion element 10 as a pixel, the lower electrode 15a is formed in a manner separated on a pixel-by-pixel basis.

The organic photoelectric conversion layer 17 includes a fullerene having undergone polysubstituted modification (fullerene derivative), together with an organic semiconductor that performs photoelectric conversion of light of a selective wavelength region while transmitting light of any other wavelength region.

The organic semiconductor desirably includes one or both of an organic p-type semiconductor and an organic n-type semiconductor. As such an organic semiconductor, one of a quinacridone derivative, a naphthalene derivative, an anthracene derivative, a phenanthrene derivative, a tetracene derivative, a pyrene derivative, a perylene derivative, and a fluoranthene derivative may be preferably used. Alternatively, a polymer such as phenylenevinylene, fluorene, carbazole, indole, pyrene, pyrrole, picoline, thiophene, acetylene, and diacetylene, or a derivative thereof may be used. In addition, a condensed polycyclic aromatic compound and a chain compound in which an aromatic cyclic or heterocyclic compound is condensed, such as a metal complex dye, a cyanine dye, merocyanine dye, a phenylxanthene dye, a triphenylmethane dye, a rhodacyanine dye, a xanthene dye, a macrocyclic azaannulene dye, an azulene dye, naphthoquinone, an anthraquinone dye, anthracene, and pyrene may be preferably used. Alternatively, two nitrogen-containing heterocyclic rings such as quinolines, benzothiazoles, and benzoxazoles each having a squarylium group and a croconic methine group as a linking chain, or a cyanine-like dye, etc., linked by the squarylium group and the croconic methine group may be preferably used. It is to be noted that, as the above-mentioned metal complex dye, a dithiol metal complex dye, a metal phthalocyanine dye, a metal porphyrin dye, or a ruthenium complex dye is preferred; however, this is not limitative. In the present embodiment, the organic photoelectric conversion layer 17 is able to perform photoelectric conversion of green light that corresponds to a portion or all of a wavelength region of 495 nm to 570 nm, for example. Such an organic photoelectric conversion layer 17 has a thickness of 50 nm to 500 nm, for example.

As the fullerene derivative, so-called $C_{60}$ fullerene, as a mother skeleton, having 60 carbon atoms preferably undergoes multiple modification by any of substituents. Specifically, the $C_{60}$ fullerene is desirably modified by a substituent having an absorbance smaller than that of the fullerene in a visible range. This shifts an absorption wavelength peak of the fullerene toward shorter wavelength side, thus reducing an influence on a spectroscopic shape of light absorbed by the organic semiconductor. It is to be noted that the visible range as used here refers to a range from 380 nm to 700 nm.

As the substituent having an absorbance smaller than that of the fullerene in the visible range, for example, a hydrogen atom, halogen (F, Cl, Br, and I) atoms, a hydroxyl group, an alkyl group, and a group containing a chalcogen element, as well as substituents made of compounds listed in Tables 1 to 3 may be used. It is to be noted that FIG. 1 also sets forth, as references, absorption wavelengths and absorbance indexes in situations where the fullerene is dissolved in hexane. Further, it is appreciated that, in a small substituent made of a single atom such as the above-described hydrogen atom and halogen atom or made of a plurality of atoms, the substituent itself has a small absorbance when taking benzene as a reference.

TABLE 1

| Compound | Solvent | $\lambda_{max}$/nm | log ε/ mol$^{-1}$ · dm$^3$ · cm$^{-1}$ |
|---|---|---|---|
| Fullerene | Hexane | 213 | 5.13 |
| | | 257 | 5.24 |
| | | 329 | 4.71 |
| | | 440-670 | 2.80 |
| Benzene | Iso-Octane | 262 | 2.09 |
| | | 255 | 2.25 |
| | | 247.5 | 2.15 |
| | | 243.5 | 1.96 |
| | | 237.5 | 1.73 |
| | | 234 | 1.51 |
| Chlorobenzene | Octane | 272 | 2.26 |
| | | 264.5 | 2.37 |
| | | 261.5 | 2.24 |
| | | 258 | 2.27 |
| | | 251.5 | 2.08 |
| | | 245 | 1.86 |
| | | 233.5 | 1.37 |
| Fluorobenzene | Iso-Octane | 266 | 2.95 |
| | | 260 | 3.02 |
| | | 254.5 | 2.83 |
| | | 249 | 2.31 |
| | | 204 | 3.90 |
| Toluene | Water | 260 | 2.48 |
| | | 206 | 3.78 |
| Phenol | Cyclohexane | 276 | 3.32 |
| | | 269 | 3.34 |
| | | 263 | 3.78 |
| | | 210 | 3.84 |

TABLE 2

| Compound | Solvent | $\lambda_{max}$/nm | log ε/ mol$^{-1}$ · dm$^3$ · cm$^{-1}$ |
|---|---|---|---|
| Acetophenone | Hexane | 325 | 1.70 |
| | | 286.5 | 2.90 |
| | | 277 | 3.00 |
| | | 237 | 4.11 |
| Acetanilide | Cyclohexane | 282 | 2.82 |
| | | 274 | 2.93 |
| | | 238 | 4.13 |
| Benzoic Acid | Cyclohexane | 282 | 2.96 |
| | | 274 | 3.02 |
| | | 268 | 2.91 |
| | | 232 | 4.10 |
| Benzonitrile | Iso-Octane | 291.5 | 1.07 |
| | | 278 | 1.16 |
| | | 276.5 | 2.81 |
| | | 268 | 2.80 |
| | | 264 | 2.65 |
| | | 262.5 | 2.64 |
| | | 258 | 2.47 |
| | | 252 | 2.25 |
| | | 229.5 | 4.05 |
| | | 225 | 4.07 |
| | | 221 | 4.09 |
| Nitrobenzene | Gas | 340 | 2.15 |
| | | 288 | 2.70 |
| | | 240 | 3.93 |
| | | 193 | 4.24 |
| | | 164 | 4.44 |

TABLE 3

| Compound | Solvent | $\lambda_{max}$/nm | log ε/ mol$^{-1}$ · dm$^3$ · cm$^{-1}$ |
|---|---|---|---|
| Aniline | Iso-Octane | 295 | 3.10 |
| | | 291 | 3.22 |
| | | 287.5 | 3.28 |
| | | 284 | 3.24 |
| | | 280 | 3.20 |
| | | 277 | 3.12 |
| | | 271 | 2.96 |
| | | 234.5 | 3.94 |
| Pyrrole | Hexane | 240 | 2.48 |
| | | 210 | 4.18 |
| Furan | Hexane | 200 | 4.00 |
| Thiophene | Iso-Octane | 231.5 | 3.73 |
| Carbazole | Chloroform | 333 | 3.51 |
| | | 309 | 3.80 |
| | | 298 | 3.60 |
| | | 292 | 4.23 |
| Dibenzothiophene | Ethanol | 324 | 3.41 |
| | | 286 | 4.02 |
| | | 235 | 4.61 |
| Thiazole | Ethanol | 240 | 3.60 |
| Copper Phthalocyanine | Pyridine | 676 | 5.17 |
| | | 609 | 4.37 |
| | | 345 | 4.59 |

Examples of the specific fullerene derivative include a compound represented by the following formula (1):

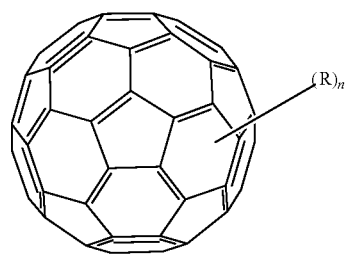

(1)

where R denotes, each independently, a hydrogen atom, a halogen atom, a linear, branched or cyclic alkyl group, a phenyl group, a group having a linear or condensed aromatic compound, a group having a halide, a partial fluoroalkyl group, a perfluoroalkyl group, a silyl alkyl group, a silyl alkoxy group, an aryl silyl group, an arylsulfanyl group, an alkylsulfanyl group, an arylsulfonyl group, an alkylsulfonyl group, an aryl sulfide group, an alkyl sulfide group, an amino group, an alkylamino group, an arylamino group, a hydroxy group, an alkoxy group, an acylamino group, an acyloxy group, a carbonyl group, a carboxy group, a carboxoamido group, a carboalkoxy group, an acyl group, a sulfonyl group, a cyano group, a nitro group, a group having a chalcogenide, a phosphine group, a phosphonic group, or a derivative thereof, provided that n is an integer of 2 or more.

It is to be noted that a substituent that modifies the fullerene is not limited to the above-mentioned substituent; any substituent not having absorption in the visible range suffices.

The number of the substituent that modifies the fullerene may be two or more as described above, and may be particularly preferably 16 or more; the upper limit of the number is 48 or less, for example. This makes it possible to shift the absorption wavelength peak of the fullerene derivative toward shorter wavelength side.

It is to be noted that the fullerene derivative may be varied to have a desired work function depending on types of the substituent. For example, in a case of using the fullerene derivative as the n-type semiconductor, it is preferable to use, as the substituent, for example, a halogen atom such as fluoride having a high electron-withdrawing property. In a case of using the fullerene derivative as the p-type semiconductor, it is preferable to use a carbon atom or a hydrogen atom having a high electron-donating property.

Further, the fullerene derivative is not limited to the $C_{60}$ fullerene, and may have, as the mother skeleton, a so-called high-order fullerene having more than 60 carbon atoms.

Any other unillustrated layer may be provided between the organic photoelectric conversion layer 17 and the lower electrode 15a and between the organic photoelectric conversion layer 17 and the upper electrode 18. For example, an underlying film, a hole transport layer, an electron blocking film, the organic photoelectric conversion layer 17, a hole blocking film, a buffer film, an electron transport layer, and a work function adjustment film may be stacked in order from side of the lower electrode 15a. The above-described fullerene derivative may be used as the electron blocking film, the hole blocking film, the electron transport layer, and the hole transport layer.

The upper electrode 18 is configured by the electrically-conductive film having light-transmissivity similarly to that of the lower electrode 15a. In the solid-state imaging device using the photoelectric conversion element 10 as a pixel, the upper electrode 18 may be separated on a pixel-by-pixel basis, or may be formed as a common electrode for the respective pixels. The upper electrode 18 has a thickness of 10 nm to 200 nm, for example.

The protective film 19 is made of a material having light-transmissivity, and is, for example, a monolayer film made of one of silicon oxide, silicon nitride, and silicon oxynitride, or alternatively is a stacked film made of two or more thereof. The protective film 19 has a thickness of 100 nm to 30,000 nm, for example.

The contact metal layer 20 is made of one of titanium, tungsten, titanium nitride, and aluminum, for example, or alternatively is configured by a stacked film made of two or more thereof.

The upper electrode 18 and the protective film 19 are provided to cover the organic photoelectric conversion layer 17, for example. FIG. 2 illustrates a planar configuration of the organic photoelectric conversion layer 17, the protective film 19 (upper electrode 18), and the contact hole H.

Specifically, a peripheral part e2 of the protective film 19 (applicable likewise to the upper electrode 18) is located outside a peripheral part e1 of the organic photoelectric conversion layer 17. The protective film 19 and the upper electrode 18 are formed to be expanded outward beyond the organic photoelectric conversion layer 17. In detail, the upper electrode 18 is formed to cover a top surface and side surfaces of the organic photoelectric conversion layer 17 and to extend up to a part on the insulating film 16. The protective film 19 is formed to cover a top surface of such an upper electrode 18 and to have a planar shape similar to that of the upper electrode 18. The contact hole H is provided in a region (region outside the peripheral part e1), of the protective film 19, that does not face the organic photoelectric conversion layer 17. Thus, a portion of a front surface of the upper electrode 18 is exposed. A distance from the peripheral part e1 to the peripheral part e2 is, for example, 1 μm to 500 μm, although the distance is not particularly limited. It is to be noted that although FIG. 2 illustrates a single rectangular contact hole H provided along an edge side of the organic photoelectric conversion layer 17, the shape and the number of the contact hole H are not limited thereto; other shapes (e.g., circular shape and square shape) may be adopted, and a plurality of contact holes H may be provided.

A planarization film 21 is formed on the protective film 19 and the contact metal layer 20 to cover the whole surface. An on-chip lens 22 (microlens) is provided on the planarization film 21. The on-chip lens 22 condenses light incident from above to each light-receiving surface of the organic photoelectric conversion section 11G, and the inorganic photoelectric conversion sections 11B and 11R. In the present embodiment, the multi-layer wiring layer 51 is formed on side of the surface S2 of the semiconductor substrate 11, thus making it possible to allow the respective light-receiving surfaces of the organic photoelectric conversion section 11G and the inorganic photoelectric conversion sections 11B and 11R to be disposed closer to one another. Thus, it becomes possible to reduce a variation in sensitivity among respective colors occurring depending on F value of the on-chip lens 22.

It is to be noted that, in the photoelectric conversion element 10 according to the present embodiment, a signal electric charge (electron) is extracted from the lower electrode 15a, and thus the solid-state imaging device using the photoelectric conversion element 10 as a pixel may adopt the upper electrode 18 as a common electrode. In this case, the above-described transmission path configured by the contact hole H, the contact metal layer 20, the wiring layers 15b and 13b, and the electrically-conductive plugs 120b1 and 120b2 may be formed at at least one location for all of the pixels.

In the semiconductor substrate 11, for example, the inorganic photoelectric conversion sections 11B and 11R and the green electricity storage layer 110G are formed to be embedded in a predetermined region of the n-type silicon (Si) layer 110. Further, the electrically-conductive plugs 120a1 and 120b1 are embedded in the semiconductor substrate 11. The electrically-conductive plugs 120a1 and 120b1 serve as a transmission path of an electric charge (electron or hole (hole)) from the organic photoelectric conversion section 11G. In the present embodiment, the rear surface (surface S1) of the semiconductor substrate 11 serves as a light-receiving surface. On side of the front surface (surface S2) of the semiconductor substrate 11, a plurality of pixel transistors (including transfer transistors Tr1 to Tr3) corresponding, respectively, to the organic photoelectric conversion section 11G and the inorganic photoelectric conversion sections 11B and 11R, are formed, and a peripheral circuit configured by a logic circuit, etc., is formed.

Examples of the pixel transistors include a transfer transistor, a reset transistor, an amplifying transistor, and a selection transistor. Each of the transistors is configured, for example, by a MOS transistor, and is formed in a p-type semiconductor well region on side of the surface S2. A circuit that includes such pixel transistors is formed for each of the photoelectric conversion sections for red, green, and blue colors. Each of the circuits may have a three-transistor configuration that includes three transistors in total, configured by the transfer transistor, the reset transistor, and the amplifying transistor, for example, among these pixel transistors. Alternatively, each of the circuits may have a four-transistor configuration that includes the selection transistor in addition thereto. Here, illustration and description are given only of the transfer transistors Tr1 to Tr3 among these pixel transistors. Further, the pixel transistor other than the transfer transistors may be shared by the photoelectric conversion sections or by the pixels. Furthermore, a so-called pixel-shared structure may also be applied in which a floating diffusion is shared.

The transfer transistors Tr1 to Tr3 each include a gate electrode (gate electrode TG1, TG2, or TG3) and a floating diffusion (FD113, FD114, or FD116). The transfer transistor Tr1 transfers, to a vertical signal line Lsig described later, a signal electric charge (electron, in the present embodiment) corresponding to a green color that is generated in the organic photoelectric conversion section 11G and is accumulated in the green electricity storage layer 110G. The transfer transistor Tr2 transfers, to the vertical signal line Lsig described later, a signal electric charge (electron, in the present embodiment) corresponding to a blue color that is generated and accumulated in the inorganic photoelectric conversion section 11B. Likewise, the transfer transistor Tr3 transfers, to the vertical signal line Lsig described later, a signal electric charge (electron, in the present embodiment) corresponding to a red color that is generated and accumulated in the inorganic photoelectric conversion section 11R.

The inorganic photoelectric conversion sections 11B and 11R are each a photodiode (Photo Diode) that has a pn junction. The inorganic photoelectric conversion sections 11B and 11R are formed in order from side of the surface S1 on an optical path in the semiconductor substrate 11. Among these, the inorganic photoelectric conversion section 11B selectively detects blue light and accumulates a signal electric charge corresponding to the blue color. The inorganic photoelectric conversion section 11B is formed to extend, for example, from a selective region along the surface S1 of the semiconductor substrate 11 to a region near an interface with the multi-layer wiring layer 51. The inorganic photoelectric conversion section 11R selectively detects red light and accumulates a signal electric charge corresponding to the red color. The inorganic photoelectric conversion section 11R is formed, for example, in a region in a lower layer (on surface S2 side) than the inorganic photoelectric conversion section 11B. It is to be noted that the blue (B) is a color that corresponds to a wavelength region from 450 nm to 495 nm, for example, and the red (R) may be a color that corresponds to a wavelength region from 620 nm to 750 nm, for example. It is enough that the inorganic photoelectric conversion sections 11B and 11R are able to detect light of a portion or all of the respective wavelength regions described above.

FIG. 3A illustrates a detailed configuration example of the inorganic photoelectric conversion sections 11B and 11R. FIG. 3B corresponds to a configuration in another cross-section in FIG. 3A. It is to be noted that, in the present embodiment, description is given of a case where, among a pair of an electron and a hole generated by photoelectric conversion, the electron is read as a signal electric charge (case where an n-type semiconductor region serves as a photoelectric conversion layer). Further, in the diagram, "+ (plus)" attached above "p" or "n" indicates that p-type or n-type impurity concentration is high. Furthermore, among the pixel transistors, the gate electrodes TG2 and TG3 of the transfer transistors Tr2 and Tr3 are also illustrated.

The inorganic photoelectric conversion section 11B includes, for example, a p-type semiconductor region (hereinafter, simply referred to as "p-type region", applicable likewise to the case of n-type) 111$p$ to serve as a hole accumulation layer, and an n-type photoelectric conversion layer (n-type region) 111$n$ to serve as an electron accumulation layer. The p-type region 111$p$ and the n-type photoelectric conversion layer 111$n$ are each formed in a selective region near the surface S1. A portion of each of the p-type region 111$p$ and the n-type photoelectric conversion layer 111$n$ is bent and formed to extend to reach the interface with the surface S2. The p-type region 111$p$ is coupled to an unillustrated p-type semiconductor well region on side of the surface S1. The n-type photoelectric conversion layer 111$n$ is coupled to the FD113 (n-type region) of the transfer transistor Tr2 for the blue color. It is to be noted that a p-type region 113$p$ (hole accumulation layer) is formed near an interface between the surface S2 and each of the end portions of the p-type region 111$p$ and the n-type photoelectric conversion layer 111$n$ on side of the surface S2.

The inorganic photoelectric conversion section 11R is formed, for example, by p-type regions 112$p$1 and 112$p$2 (hole accumulation layers), with an n-type photoelectric conversion layer 112$n$ (electron accumulation layer) being interposed therebetween (has a p-n-p stacked structure). A portion of the n-type photoelectric conversion layer 112$n$ is bent and formed to extend to reach the interface with the surface S2. The n-type photoelectric conversion layer 112$n$ is coupled to the FD 114 (n-type region) of the transfer transistor Tr3 for the red color. It is to be noted that the p-type region 113$p$ (hole accumulation layer) is formed at least near the interface between the surface S2 and an end portion of the n-type photoelectric conversion layer 111$n$ on side of the surface S2.

FIG. 4 illustrates a detailed configuration example of the green electricity storage layer 110G. It is to be noted that description is given here of a case where, among a pair of an electron and a hole generated by the organic photoelectric conversion section 11G, the electron is read as a signal electric charge from side of the lower electrode 15$a$. Further, FIG. 4 also illustrates the gate electrode TG1 of the transfer transistor Tr1 among the pixel transistors.

The green electricity storage layer 110G includes an n-type region 115$n$ that serves as an electron accumulation layer. A portion of the n-type region 115$n$ is coupled to the electrically-conductive plug 120$a$1, and accumulates electrons supplied from side of the lower electrode 15$a$ via the electrically-conductive plug 120$a$1. The n-type region 115$n$ is also coupled to the FD 116 (n-type region) of the transfer transistor Tr1 for the green color. It is to be noted that a p-type region 115$p$ (hole accumulation layer) is formed near an interface between the n-type region 115$n$ and the surface S2.

The electrically-conductive plugs 120$a$1 and 120$b$1, together with the electrically-conductive plugs 120$a$2 and 120$b$2 described later, each function as a connector between the organic photoelectric conversion section 11G and the semiconductor substrate 11, and forms a transmission path for electrons or holes generated in the organic photoelectric conversion section 11G. In the present embodiment, the electrically-conductive plug 120$a$1 is conducted to the lower electrode 15$a$ of the organic photoelectric conversion section 11G, and is coupled to the green electricity storage layer 110G. The electrically-conductive plug 120$b$1 is conducted to the upper electrode 18 of the organic photoelectric conversion section 11G, and serves as a wiring line for discharge of holes.

These electrically-conductive plugs 120$a$1 and 120$b$1 are each configured, for example, by an electrically-conductive type semiconductor layer, and are each formed to be embedded in the semiconductor substrate 11. In this case, the electrically-conductive plug 120$a$1 may be favorably of an n-type (because it serves as the transmission path of electrons). The electrically-conductive plug 120$b$1 may be favorably of a p-type (because it serves as the transmission path of holes). Alternatively, the electrically-conductive plugs 120*a*1 and 120*b*1 may be each made of, for example, an electrically-conductive film material such as tungsten embedded in a through-via. In this case, for example, in order to suppress short circuit with silicon, a side surface of the via is desirably covered with an insulating film made of a material such as silicon oxide ($SiO_2$) and silicon nitride (SiN).

The multi-layer wiring layer 51 is formed on the surface S2 of the semiconductor substrate 11. In the multi-layer wiring layer 51, a plurality of wiring lines 51*a* are arranged with an interlayer insulating film 52 being interposed therebetween. In this manner, the multi-layer wiring layer 51 is formed on side opposite to the light-receiving surface in the photoelectric conversion element 10. Thus, a so-called backside illumination type solid-state imaging device is achievable. A support substrate 53 made of silicon, for example, is joined to the multi-layer wiring layer 51.

(1-2. Manufacturing Method)

For example, it is possible to manufacture the photoelectric conversion element 10 as follows. FIGS. 5A to 7C illustrate a manufacturing method of the photoelectric conversion element 10 in order of steps. It is to be noted that FIGS. 7A to 7C illustrate only a configuration of a main part of the photoelectric conversion element 10.

First, the semiconductor substrate 11 is formed. Specifically, a so-called SOI substrate is prepared, in which the silicon layer 110 is formed on a silicon base 1101 with a silicon oxide film 1102 being interposed therebetween. It is to be noted that a surface on side of the silicon oxide film 1102 of the silicon layer 110 serves as a rear surface (surface S1) of the semiconductor substrate 11. FIGS. 5A and 5B illustrate the structure illustrated in FIG. 1 in a vertically inverted state. Subsequently, as illustrated in FIG. 5A, the electrically-conductive plugs 120*a*1 and 120*b*1 are formed in the silicon layer 110. In this situation, it is possible to form the electrically-conductive plugs 120*a*1 and 120*b*1, for example, by forming through-vias in the silicon layer 110 and thereafter embedding, inside the through-vias, tungsten and barrier metal such as the above-described silicon nitride. Alternatively, for example, ion implantation into the silicon layer 110 may be adopted to form an electrically conductive impurity semiconductor layer. In this case, the electrically-conductive plugs 120*a*1 and 120*b*1 are formed, respectively, as an n-type semiconductor layer and a p-type semiconductor layer. Thereafter, for example, the inorganic photoelectric conversion sections 11B and 11R each having the p-type region and n-type region illustrated in FIG. 3A are formed by ion implantation in regions having different depths inside the silicon layer 110 (so as to overlap each other). Further, the green electricity storage layer 110G is formed by ion implantation at a region adjacent to the electrically-conductive plug 120*a*1. In this manner, the semiconductor substrate 11 is formed.

Subsequently, the pixel transistor including the transfer transistors Tr1 to Tr3, and the peripheral circuit such as a logic circuit are formed on side of the surface S2 of the semiconductor substrate 11. Thereafter, as illustrated in FIG. 5B, the plurality of wiring lines 51*a* are formed on the surface S2 of the semiconductor substrate 11, with the interlayer insulating film 52 being interposed therebetween to thereby form the multi-layer wiring layer 51. Subsequently, the support substrate 53 made of silicon is joined onto the multi-layer wiring layer 51. Thereafter, the silicon base 1101 and the silicon oxide film 1102 are peeled off from side of the surface S1 of the semiconductor substrate 11 to expose the surface S1 of the semiconductor substrate 11.

Next, the organic photoelectric conversion section 11G is formed on the surface S1 of the semiconductor substrate 11. Specifically, as illustrated in FIG. 6A, first, the interlayer insulating film 12 configured by the stacked film of a hafnium oxide film and a silicon oxide film as described above is formed on the surface S1 of the semiconductor substrate 11. For example, the hafnium oxide film is formed by an atomic layer deposition (ALD) method, and thereafter, for example, the silicon oxide film is formed by a plasma chemical vapor deposition (CVD) method. Thereafter, contact holes H1*a* and H1*b* are formed at locations corresponding to the respective electrically-conductive plugs 120*a*1 and 120*b*1 of the interlayer insulating film 12. The electrically-conductive plugs 120*a*2 and 120*b*2 made of the above-described material are formed to fill the contact holes H1*a* and H1*b*, respectively. In this situation, the electrically-conductive plugs 120*a*2 and 120*b*2 may be each formed to expand to a region that is desired to be light-shielded (to cover the region that is desired to be light-shielded). Alternatively, a light-shielding layer may be formed at a region separated from the electrically-conductive plugs 120*a*2 and 120*b*2.

Subsequently, as illustrated in FIG. 6B, the interlayer insulating film 14 made of the above-described material is formed by the plasma CVD method, for example. It is to be noted that, after the formation of the film, a surface of the interlayer insulating film 14 is desirably planarized by a chemical mechanical polishing (CMP) method, for example. Next, contact holes are opened at locations corresponding to the electrically-conductive plugs 120*a*2 and 120*b*2 of the interlayer insulating film 14. The contact holes are filled with the above-described material to form the wiring layers 13*a* and 13*b*. It is to be noted that the CMP method, for example, may be desirably used thereafter to remove a residual wiring layer material (such as tungsten) on the interlayer insulating film 14. Next, the lower electrode 15*a* is formed on the interlayer insulating film 14. Specifically, first, the above-described transparent electrically-conductive film is formed throughout the entire surface of the interlayer insulating film 14 by a sputtering method, for example. Thereafter, a photolithography method is used (exposure, development, post-bake, etc. of a photoresist film is performed), and a selective part is removed by dry etching or wet etching, for example, thus forming the lower electrode 15*a*. In this situation, the lower electrode 15*a* is formed at a region that faces the wiring layer 13*a*. Further, upon the process of the transparent electrically-conductive film, the transparent electrically-conductive film is allowed to remain also at a region that faces the wiring layer 13*b*, thereby forming the wiring layer 15*b* that constitutes a portion of the transmission path of holes, together with the lower electrode 15*a*.

Subsequently, the insulating film 16 is formed. In this situation, first, the insulating film 16 made of the above-described material is formed, for example, by the plasma CVD method throughout the entire surface of the semiconductor substrate 11 to cover the interlayer insulating film 14, the lower electrode 15*a*, and the wiring layer 15*b*. Thereafter, as illustrated in FIG. 7A, the formed insulating film 16 is polished, for example, by the CMP method. Thus, the lower electrode 15*a* and the wiring layer 15*b* are exposed from the insulating film 16, and a step difference between the lower electrode 15*a* and the insulating film 16 are moderated (desirably planarized).

Next, as illustrated in FIG. 7B, the organic photoelectric conversion layer 17 is formed on the lower electrode 15*a*. In this situation, a photoelectric conversion material made of the above-described material is patterned to be formed by a vacuum deposition method using a metal mask, for example. It is to be noted that, as described above, when other organic layers (such as electron blocking layer) are formed as an upper layer or a lower layer of the organic photoelectric conversion layer 17, it is desirable to form the layers successively in a vacuum process (through a vacuum consistent process) using the same metal mask. Further, the film-forming method of the organic photoelectric conversion layer 17 is not necessarily limited to the above-described method using the metal mask; any other method, for example, a printing technique may be used.

Subsequently, as illustrated in FIG. 7C, the upper electrode 18 and the protective film 19 are formed. First, the upper electrode 18 configured by the above-described transparent electrically-conductive film is formed, by the vacuum deposition method or the sputtering method, for example, throughout the entire surface of the substrate to cover the top surface and the side surfaces of the organic photoelectric conversion layer 17. It is to be noted that the upper electrode 18 is desirably formed with the organic photoelectric conversion layer 17 through the vacuum consistent process, because characteristics of the organic photoelectric conversion layer 17 are easily varied under influences of moisture, oxygen, hydrogen, etc. Thereafter (before patterning of the upper electrode 18), the protective film 19 made of the above-described material is formed by the plasma CVD method, for example, to cover the top surface of the upper electrode 18. Subsequently, the protective film 19 is formed on the upper electrode 18, and thereafter the upper electrode 18 is processed.

Thereafter, etching by means of the photolithography method is used to collectively remove a selective part of each of the upper electrode 18 and the protective film 19. Subsequently, the contact hole H is formed in the protective film 19, for example, by the etching by means of the photolithography method. In this situation, the contact hole H is desirably formed in a region not facing the organic photoelectric conversion layer 17. Even after the formation of the contact hole H, as described above, the photoresist is peeled off, and washing using chemical solution is performed in a manner similar to that described above. Thus, it follows that the upper electrode 18 is exposed from the protective film 19 at the region facing the contact hole H. Therefore, in consideration of generation of a pin hole as described above, the region where the organic photoelectric conversion layer 17 is formed is desirably avoided to provide the contact hole H. Subsequently, the contact metal layer 20 made of the above-described material is formed using the sputtering method, for example. In this situation, the contact metal layer 20 is formed on the protective film 19 to fill the contact hole H and to extend up to the top surface of the wiring layer 15b. Finally, the planarization film 21 is formed throughout the entire surface of the semiconductor substrate 11, and thereafter the on-chip lens 22 is formed on the planarization film 21 to complete the photoelectric conversion element 10 illustrated in FIG. 1.

As a pixel of the solid-state imaging device, the photoelectric conversion element 10 as described above, for example, obtains a signal electric charge as follows. That is, as illustrated in FIG. 8, when light L is incident through the on-chip lens 22 (not illustrated in FIG. 8), the light L passes through the organic photoelectric conversion section 11G and the inorganic photoelectric conversion sections 11B and 11R in order, and undergoes photoelectric conversion of each color of red, green, and blue through the passing process. FIG. 9 schematically illustrates a flow in which the signal electric charge (electron) is obtained on the basis of the incident light. Description is given below of a specific operation of signal obtainment in each of the photoelectric conversion sections.

(Obtainment of Green Signal by Organic Photoelectric Conversion Section 11G)

Green light Lg, among the light L incident on the photoelectric conversion element 10, is first detected (absorbed) selectively in the organic photoelectric conversion section 11G to undergo the photoelectric conversion. Accordingly, an electron Eg of the electron-hole pair generated is extracted from side of the lower electrode 15a, and thereafter is accumulated in the green electricity storage layer 110G through a transmission path A (wiring layer 13a and electrically-conductive plugs 120a1 and 120a2). The accumulated electron Eg is transferred to the FD 116 upon a reading operation. It is to be noted that a hole Hg is discharged from side of the upper electrode 18 through a transmission path B (contact metal layer 20, wiring layers 13b and 15b, and electrically-conductive plugs 120b1 and 120b2).

Specifically, the signal electric charge is accumulated as follows. That is, in the present embodiment, for example, a predetermined negative potential VL (<0 V) is applied to the lower electrode 15a, and a potential VU (<VL) lower than the potential VL is applied to the upper electrode 18. It is to be noted that the potential VL is supplied, for example, from the wiring line 51a inside the multi-layer wiring layer 51 to the lower electrode 15a through the transmission path A. The potential VL is supplied, for example, from the wiring line 51a inside the multi-layer wiring layer 51 to the upper electrode 18 through the transmission path B. Accordingly, in a state where an electric charge is accumulated (where the unillustrated reset transistor and the transfer transistor Tr1 are each in an OFF state), the electron, among the electron-hole pair generated in the organic photoelectric conversion layer 17, is guided toward side of the lower electrode 15a having a relatively high potential (the hole is guided toward side of the upper electrode 18). In this manner, the electron Eg is extracted from the lower electrode 15a, and is accumulated in the green electricity storage layer 110G (n-type region 115n, in detail) through the transmission path A. Further, the accumulation of the electron Eg also causes the potential VL of the lower electrode 15a conducted to the green electricity storage layer 110G to fluctuate. This amount of the variation in the potential VL corresponds to the signal potential (here, potential of a green signal).

Further, upon the reading operation, the transfer transistor Tr1 is turned into an ON state, and the electron Eg accumulated in the green electricity storage layer 110G is transferred to the FD116. This causes the green signal based on a light reception amount of the green light Lg to be read by the vertical signal line Lsig described later through unillustrated another pixel transistor. Thereafter, the unillustrated reset transistor and the transfer transistor Tr1 are turned into an ON state, and the FD116 being the n-type region and an electricity storage region of the green electricity storage layer 110G (n-type region 115n) are reset to a power supply voltage VDD, for example.

(Obtainment of Blue Signal and Red Signal by Inorganic Photoelectric Conversion Sections 11B and R)

Subsequently, among the light having been transmitted through the organic photoelectric conversion section 11G, blue light and red light are absorbed in order, respectively, in the inorganic photoelectric conversion section 11B and the inorganic photoelectric conversion section 11R to each undergo the photoelectric conversion. In the inorganic photoelectric conversion section 11B, an electron Eb corresponding to incident blue light is accumulated in the n-type region (n-type photoelectric conversion layer 111n), and the accumulated electron Ed is transferred to the FD 113 upon the reading operation. It is to be noted that the hole is accumulated in the unillustrated p-type region. Likewise, in the inorganic photoelectric conversion section 11R, an electron Er corresponding to the incident red light is accumulated in the n-type region (n-type photoelectric conversion layer 112n), and the accumulated electron Er is transferred to the FD 114 upon the reading operation. It is to be noted that the hole is accumulated in the unillustrated p-type region.

As described above, in the state where the electric charge is accumulated, the negative potential VL is applied to the lower electrode 15a of the organic photoelectric conversion section 11G. Thus, the p-type region (p-type region 111p in FIG. 2) being the hole accumulation layer of the inorganic photoelectric conversion section 11B tends to have an increased hole concentration. Accordingly, it becomes possible to suppress occurrence of a dark current at the interface between the p-type region 111p and the interlayer insulating film 12.

Upon the reading operation, similarly to the above-described organic photoelectric conversion section 11G, the transfer transistors Tr2 and Tr3 are turned into an ON state, and the electrons Eb and Er accumulated, respectively, in the n-type photoelectric conversion layers 111n and 112n are transferred, respectively, to the FD113 and FD114. This causes each of the blue signal based on a light reception amount of the blue light Lb and the red signal based on a light reception amount of the red light Lr to be read by the vertical signal line Lsig described later through unillustrated another pixel transistor. Thereafter, the unillustrated reset transistor and the transfer transistors Tr2 and Tr3 are turned into an ON state, and the FD113 and FD114 being the n-type region are reset to the power supply voltage VDD, for example.

In this manner, by stacking the organic photoelectric conversion section 11G and the inorganic photoelectric conversion sections 11B and 11R in the vertical direction, it becomes possible to detect pieces of color light of red, green, and blue separately without providing a color filter, thus allowing a signal electric charge of each color to be obtained. This makes it possible to suppress optical loss (reduction in sensitivity) caused by color light absorption by the color filter as well as occurrence of a false color associated with a pixel interpolation process.

(1-3. Workings and Effects)

As described above, in recent years, a solid-state imaging device such as the CCD image sensor and the CMOS image sensor has been requested to have high sensitivity, low noise, and high color reproducibility. In order to achieve these, a solid-state imaging device has been developed. The solid-state imaging device includes an organic photoelectric conversion section that detects green light and generates a signal electric charge in accordance with the green light and photodiodes (inorganic photoelectric conversion sections) that detect red light and blue light, respectively, to obtain three color signals in a single pixel, thus allowing for improvement in a photoelectric conversion efficiency in the single pixel as well as improvement in the sensitivity. Further, a photoelectric conversion element, etc., has been developed. The photoelectric conversion element, etc., has further enhanced optical conversion efficiency by adding, together with a photoelectric conversion dye, the fullerene or the fullerene derivative to the photoelectric conversion film.

However, the solid-state imaging device, using the photoelectric conversion element, to which the fullerene or the derivative thereof is simply added has issues as follows. A broad absorption spectrum appears due to an interaction between fullerenes, and the spectroscopic shape of light selectively absorbed by the photoelectric conversion dye is deteriorated, thus lowering the color reproducibility.

Thus, in the present embodiment, the organic semiconductor as the photoelectric conversion dye and the fullerene having undergone polysubstituted modification (fullerene derivative) are used for the organic photoelectric conversion layer 17 provided between the lower electrode 15a and the upper electrode 18.

FIG. 10 illustrates ultraviolet visible absorption spectra (UV-vis), standardized with a film thickness, of $C_{60}F_{36}$ that is one of polysubstituted fullerenes and of a fullerene ($C_{60}$) as a comparative example. The ultraviolet visible absorption spectra of $C_{60}F_{36}$ and $C_{60}$ were each measured by producing a thin film having a thickness of 50 nm on quartz using a vacuum deposition equipment. It can be appreciated from FIG. 10 that $C_{60}$ has a broad absorption in a visible range equal to or lower than 600 nm, whereas $C_{60}F_{36}$ does not have a maximum absorption near the visible range (ranging from 380 nm to 700 nm). Therefore, it can be seen that $C_{60}F_{36}$ has a lower absorbance than that of $C_{60}$.

FIG. 11 illustrates ultraviolet visible absorption spectra (UV-vis) of various fullerene derivatives. The ultraviolet visible absorption spectra of the various fullerene derivatives ($C_{60}Rn(R=F: n=2$ to 36, $R=H: n=20$, $R=Me: n=20$, and $R=Cl: n=24$)) were each obtained by carrying out a structure optimization calculation by means of Gaussian 09 and making simulation of the optimized structure using a time-dependent density functional theory (TD-DFT). In detail, with respect to the ultraviolet visible absorption spectra (UV-vis) of various fullerene derivatives, UV-bis calculation using TD-DFT was performed for the optimized structure, at a calculation level of B3LYP functional, using, as a basis function, a function form (6–31+G (d,p)) in which a polarization function and a dispersion function are added to a double basis set. It can be appreciated from FIG. 11 that, in association with increase in substitution number, the absorption peak is shifted toward a shorter wavelength, thus causing the absorption in the visible range to be smaller. Further, it is apparent, from respective shifts of absorption spectra of $C_{60}H_{20}$ and $C_{60}Fn$ with respect to an absorption spectrum of $C_{60}$, that this tendency is independent of characteristics (electron-withdrawing property or electron-donating property) of the substituents.

FIG. 12 illustrates current-voltage characteristics of the organic photoelectric conversion section 11G in the present embodiment before and after light irradiation. FIG. 13 illustrates ultraviolet visible absorption spectra of the organic photoelectric conversion layer 17 that constitutes the organic photoelectric conversion section 11G. In the organic photoelectric conversion section 11G, subphthalocyanine is used as the organic semiconductor (dye) and $C_{60}F_{36}$ is used as the fullerene derivative. The organic photoelectric conversion section 11G has a configuration in which the organic photoelectric conversion layer 17 is provided on an ITO layer (lower electrode 15a) that is provided on a quartz substrate by subjecting the subphthalocyanine and $C_{60}F_{36}$ to codeposition using the vacuum deposition equipment, with an AlSiCu layer (upper electrode 18) being further provided. A light source, a filter, and a semiconductor parameter analyzer were used for the organic photoelectric conversion section 11G to measure a current value before and after the light irradiation. As appreciated from FIG. 12, it can be seen that the organic photoelectric conversion section 11G of the present embodiment has a photoelectric conversion function, from observation of a light current upon the light irradiation. Further, it was confirmed, from FIG. 13, that the organic photoelectric conversion layer 17 of the present embodiment has no such an absorption, near 400 nm, as seen in a photoelectric conversion layer made of subphthalocyanine and $C_{60}$, and that its spectroscopic shape has a rise similar to that of the photoelectric conversion layer made only of subphthalocyanine. In other words, it can be seen that $C_{60}F_{36}$ does not inhibit the spectroscopic shape of the subphthalocyanine.

As described above, in the present embodiment, the organic photoelectric conversion layer 17 provided between the lower electrode 15a and the upper electrode 18 is configured by the organic semiconductor and the fullerene having undergone polysubstituted modification (fullerene derivative). Subjecting the fullerene to the polysubstituted modification causes the absorption peak wavelength of the fullerene to be shifted toward shorter wavelength side, and reduces the interaction between fullerenes. This improves the spectroscopic shape of the photoelectric conversion element using the fullerene, thus enhancing the optical conversion efficiency of the predetermined wavelength region. In other words, it is possible to enhance the photoelectric conversion efficiency without deteriorating the spectroscopic shape of the organic photoelectric conversion layer 17. Thus, the use of the photoelectric conversion element 10 of the present embodiment in the solid-state imaging device described later makes it possible to enhance the color reproducibility.

2. APPLICATION EXAMPLES

Application Example 1

FIG. 14 illustrates an overall configuration of the solid-state imaging device (solid-state imaging device 1) that uses, as each pixel, the photoelectric conversion element 10 described in the foregoing embodiment. The solid-state imaging device 1 is a CMOS imaging sensor. The solid-state imaging device 1 has a pixel section 1a as an imaging region on the semiconductor substrate 11. Further, the solid-state imaging device 1 includes, for example, a peripheral circuit section 130 configured by a row scanning section 131, a horizontal selection section 133, a column scanning section 134, and a system controller 132 in a peripheral region of the pixel section 1a.

The pixel section 1a includes, for example, a plurality of unit pixels P (corresponding to photoelectric conversion elements 10) that are arranged two-dimensionally in matrix. To the unit pixels P, for example, pixel drive lines Lread (specifically, row selection lines and reset control lines) are wired on a pixel-row basis, and vertical signal lines Lsig are wired on a pixel-column basis. The pixel drive line Lread transmits a drive signal for reading of a signal from the pixel. One end of the pixel drive line Lread is coupled to an output terminal corresponding to each row in the row scanning section 131.

The row scanning section 131 is configured by a shift register, an address decoder, etc. The row scanning section 131 is, for example, a pixel drive section that drives the respective pixels P in the pixel section 1a on a row-unit basis. Signals outputted from the respective pixels P in the pixel row selectively scanned by the row scanning section 131 are supplied to the horizontal selection section 133 via the respective vertical signal lines Lsig. The horizontal selection section 133 is configured by an amplifier, a horizontal selection switch, etc., that are provided for each vertical signal line Lsig.

The column scanning section 134 is configured by a shift register, an address decoder, etc. The column scanning section 134 sequentially drives the respective horizontal selection switches in the horizontal selection section 133 while scanning the respective horizontal selection switches in the horizontal selection section 133. The selective scanning by the column scanning section 134 causes signals of the respective pixels to be transmitted via the respective vertical signal lines Lsig are sequentially outputted to horizontal signal lines 135, and are transmitted to the outside of the semiconductor substrate 11 through the horizontal signal lines 135.

A circuit part configured by the row scanning section 131, the horizontal selection section 133, the column scanning section 134, and the horizontal signal lines 135 may be formed directly on the substrate 11, or may be arranged in an external control IC. Alternatively, the circuit part may be formed on another substrate coupled with use of a cable, etc.

The system controller 132 receives a clock, data instructing an operation mode, etc., that are supplied from the outside of the substrate 11. The system controller 132 also outputs data such as internal information of the solid-state imaging device 1. The system controller 132 further includes a timing generator that generates various timing signals, and performs drive control of peripheral circuits such as the row scanning section 131, the horizontal selection section 133, and the column scanning section 134 on the basis of the various timing signals generated by the timing generator.

Application Example 2

The above-described solid-state imaging device 1 is applicable to any type of electronic apparatus having an imaging function, for example, a camera system such as a digital still camera and a video camera, and a mobile phone having the imaging function. FIG. 14 illustrates an outline configuration of an electronic apparatus 2 (camera) as an example thereof. This electronic apparatus 2 may be, for example, a video camera that is able to photograph a still image or a moving image. The electronic apparatus 2 includes, for example, the solid-state imaging device 1, an optical system (optical lens) 310, a shutter device 311, a drive section 313 that drives the solid-state imaging device 1 and the shutter device 311, and a signal processing section 312.

The optical system 310 guides image light (incident light) from a subject to the pixel section 1a in the solid-state imaging device 1. The optical system 310 may be configured by a plurality of optical lenses. The shutter device 311 controls periods of light irradiation and light shielding with respect to the solid-state imaging device 1. The drive section 313 controls a transfer operation of the solid-state imaging device 1 and a shutter operation of the shutter device 311. The signal processing section 312 performs various signal processes on a signal outputted from the solid-state imaging device 1. An image signal Dout after the signal process is stored in a storage medium such as a memory, or outputted to a monitor, etc.

Description has been given hereinabove referring to the embodiment; however, content of the disclosure is not limited to the foregoing embodiment and the like, and various modifications may be made. For example, in the above-described embodiment, the photoelectric conversion element (solid-state imaging device) has a configuration in which the organic photoelectric conversion section 11G that detects green light, and the inorganic photoelectric conversion sections 11B and 11R that detect blue light and red light, respectively, are stacked. However, the content of the disclosure is not limited to such a structure. In other words, red light or blue light may be detected in the organic photoelectric conversion section, and green light may be detected in the inorganic photoelectric conversion section.

Further, the numbers of these organic and inorganic photoelectric conversion sections, and the ratio therebetween are not limitative. Two or more organic photoelectric conversion sections may be provided, or color signals of a plurality of colors may be obtained only by the organic photoelectric conversion sections. Furthermore, the organic photoelectric conversion section and the inorganic photoelectric conversion section are not limited to have a vertically-stacked structure, and may be arranged side by side along the substrate surface.

Moreover, the foregoing embodiment exemplifies the configuration of the backside illumination type solid-state imaging device; however, the content of the disclosure is also applicable to a solid-state imaging device of a front surface illumination type. Further, the solid-state imaging device (photoelectric conversion element) of the disclosure does not necessarily include all of the components described in the foregoing embodiment, and may include any other layer, conversely.

It is to be noted that the effects described herein are merely examples and are not necessarily limitative; the effects may further include other effects.

It is to be noted that the present disclosure may have the following configurations.

[1]
A photoelectric conversion element including:
a first electrode and a second electrode that are disposed to face each other; and
an organic semiconductor layer that is provided between the first electrode and the second electrode, and contains a fullerene derivative modified by a substituent having an absorbance smaller than that of a fullerene in a visible range.

[2]
The photoelectric conversion element according to [1], in which the fullerene derivative is represented by formula (1):

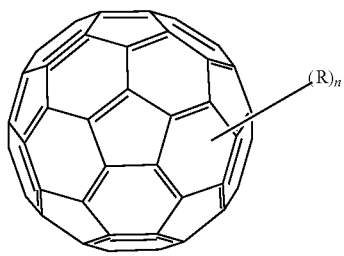

(1)

where R denotes, each independently, a hydrogen atom, a halogen atom, a linear, branched or cyclic alkyl group having carbon atoms ranging from 1 to 12, a phenyl group, a group having a linear or condensed aromatic compound, a group having a halide, a partial fluoroalkyl group, a perfluoroalkyl group, a silyl alkyl group, a silyl alkoxy group, an aryl silyl group, an arylsulfanyl group, an alkylsulfanyl group, an arylsulfonyl group, an alkylsulfonyl group, an aryl sulfide group, an alkyl sulfide group, an amino group, an alkylamino group, an arylamino group, a hydroxy group, an alkoxy group, an acylamino group, an acyloxy group, a carbonyl group, a carboxy group, a carboxoamido group, a carboalkoxy group, an acyl group, a sulfonyl group, a cyano group, a nitro group, a group having a chalcogenide, a phosphine group, a phosphonic group, or a derivative thereof, provided that n is an integer of 2 or more.

[3]
The photoelectric conversion element according to [1] or [2], in which the number of the substituent that modifies the fullerene derivative ranges from 2 to 48.

[4]
The photoelectric conversion element according to any one of [1] to [3], in which the organic semiconductor layer includes an organic semiconductor that absorbs light of a selective wavelength region.

[5]
The photoelectric conversion element according to any one of [1] to [4], in which the organic semiconductor layer has a photoelectric conversion function.

[6]
A solid-state imaging device provided with pixels each having one or a plurality of organic photoelectric conversion sections, the organic photoelectric conversion section including:
a first electrode and a second electrode that are disposed to face each other; and
an organic semiconductor layer that is provided between the first electrode and the second electrode, and contains a fullerene derivative modified by a substituent having an absorbance smaller than that of a fullerene in a visible range.

[7]
The solid-state imaging device according to [6], in which, in each of the pixels, the one or plurality of organic photoelectric conversion sections and one or a plurality of inorganic photoelectric conversion sections are stacked, the one or plurality of inorganic photoelectric conversion sections performing photoelectric conversion of a wavelength region different from that of the organic photoelectric conversion section.

[8]
The solid-state imaging device according to [7], in which
the inorganic photoelectric conversion section is formed to be embedded inside a semiconductor substrate, and
the organic photoelectric conversion section is formed on first surface side of the semiconductor substrate.

[9]
The solid-state imaging device according to any one of [6] to [8], in which a multi-layer wiring layer is formed on second surface side of the semiconductor substrate.

[10]
The solid-state imaging device according to any one of [6] to [9], in which
the organic photoelectric conversion section performs the photoelectric conversion of green light, and
the inorganic photoelectric conversion section that performs the photoelectric conversion of blue light and the inorganic photoelectric conversion section that performs the photoelectric conversion of red light are stacked inside the semiconductor substrate.

[11]
An electronic apparatus with a solid-state imaging device, the solid-state imaging device being provided with pixels each having one or a plurality of organic photoelectric conversion sections, the organic photoelectric conversion section including:
a first electrode and a second electrode that are disposed to face each other; and an organic semiconductor layer that is provided between the first electrode and the second electrode, and contains a fullerene derivative modified by a substituent having an absorbance smaller than that of a fullerene in a visible range.

This application is based upon and claims priority from Japanese Patent Application No. 2015-108832 filed with the Japan Patent Office on May 28, 2015, the entire contents of which are hereby incorporated by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photoelectric conversion element, comprising:
a semiconductor substrate that includes an electricity storage layer and a first pair of electrically-conductive plugs, wherein
the first pair of electrically-conductive plugs is embedded in the semiconductor substrate, and
the first pair of electrically-conductive plugs includes a first electrically-conductive plug and a second electrically-conductive plug; and
a photoelectric conversion section on a surface of the semiconductor substrate, wherein the photoelectric conversion section includes:
a first electrode;
a second electrode, wherein the first electrode is opposite to the second electrode;
protective film on a surface of the second electrode, wherein the protective film comprises a contact hole that exposes the surface of the second electrode;
a metal layer in the contact hole of the protective film;
an organic semiconductor layer between the first electrode and the second electrode, wherein
the second electrode covers a top surface and a plurality of side surfaces of the organic semiconductor layer,
the organic semiconductor layer contains a fullerene derivative modified by a substituent,
the substituent has an absorbance smaller than that of a fullerene in a visible range, and
the fullerene derivative is represented by formula (1):

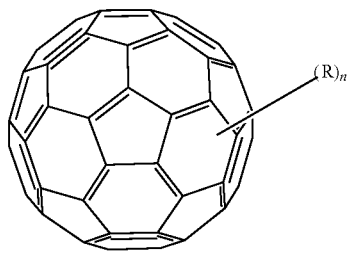

(1)

where R denotes at least a halogen atom;
a first interlayer insulating film on the surface of the semiconductor substrate, wherein the first interlayer insulating film includes through-holes;
a second interlayer insulating film on the first interlayer insulating film, wherein the second interlayer insulating film includes a first wiring layer and a second wiring layer;
a specific insulating film on the second interlayer insulating film;
a third wiring layer, wherein
the specific insulating film is between the first electrode and the third wiring layer,
the specific insulating film is in contact with each of the first electrode and the third wiring layer, and
the metal layer is in contact with the specific insulating film and the third wiring layer; and
a second pair of electrically-conductive plugs embedded in the through-holes, wherein
the second pair of electrically-conductive plugs includes a third electrically-conductive plug and a fourth electrically-conductive plug,
the electricity storage layer is connected to the first electrode via the first electrically-conductive plug, the third electrically-conductive plug, and the first wiring layer,
the electricity storage layer is configured to store first electric charges for the first electrode,
the first wiring layer is connected to the third electrically-conductive plug, and the second wiring layer is connected to the fourth electrically-conductive plug, and
the second electrically-conductive plug, the metal layer, the second wiring layer, and the fourth electrically-conductive plug form a discharge path for second electric charges for the second electrode.

2. The photoelectric conversion element according to claim 1, where R further denotes, each independently, a hydrogen atom, a linear, branched or cyclic alkyl group having carbon atoms ranging from 1 to 12, a phenyl group, a group having a linear or condensed aromatic compound, a group having a halide, a partial fluoroalkyl group, a perfluoroalkyl group, a silyl alkyl group, a silyl alkoxy group, an aryl silyl group, an arylsulfanyl group, an alkylsulfanyl group, an arylsulfonyl group, an alkylsulfonyl group, an aryl sulfide group, an alkyl sulfide group, an amino group, an alkylamino group, an arylamino group, a hydroxy group, an alkoxy group, an acylamino group, an acyloxy group, a carbonyl group, a carboxy group, a carboxoamido group, a carboalkoxy group, an acyl group, a sulfonyl group, a cyano group, a nitro group, a group having a chalcogenide, a phosphine group, a phosphonic group, or a derivative thereof, provided that n is an integer of 2 or more.

3. The photoelectric conversion element according to claim 1, wherein a number of the substituent that modifies the fullerene derivative ranges from 2 to 48.

4. The photoelectric conversion element according to claim 1, wherein the organic semiconductor layer includes an organic semiconductor configured to absorb light of a selective wavelength region.

5. The photoelectric conversion element according to claim 1, wherein the organic semiconductor layer has a photoelectric conversion function.

* * * * *